US010250166B2

(12) United States Patent
Anderson et al.

(10) Patent No.: US 10,250,166 B2
(45) Date of Patent: Apr. 2, 2019

(54) TRANSFORMER AND PRIMING CIRCUIT THEREFOR

(75) Inventors: Iain Alexander Anderson, Auckland (NZ); Thomas Gregory McKay, Auckland (NZ); Benjamin Marc O'Brien, Auckland (NZ); Emilio Patricio Calius, Auckland (NZ)

(73) Assignee: Auckland UniServices Limited, Auckland (NZ)

( * ) Notice: Subject to any disclaimer, the term of this patent is extended or adjusted under 35 U.S.C. 154(b) by 1186 days.

(21) Appl. No.: 13/382,901

(22) PCT Filed: Jul. 7, 2010

(86) PCT No.: PCT/NZ2010/000143
§ 371 (c)(1),
(2), (4) Date: Jun. 26, 2012

(87) PCT Pub. No.: WO2011/005123
PCT Pub. Date: Jan. 13, 2011

(65) Prior Publication Data
US 2012/0299514 A1    Nov. 29, 2012

(30) Foreign Application Priority Data

Jul. 7, 2009 (NZ) .................................. 578275
Dec. 4, 2009 (NZ) .................................. 581651

(51) Int. Cl.
*H01L 41/04*        (2006.01)
*H02N 2/18*         (2006.01)
(Continued)

(52) U.S. Cl.
CPC .......... *H02N 2/181* (2013.01); *H01L 41/107* (2013.01); *H01L 41/193* (2013.01)

(58) Field of Classification Search
CPC .............. H05B 33/0815; H02M 3/158; H02M 2001/007; Y10T 307/406; H02J 1/1012
See application file for complete search history.

(56) References Cited

U.S. PATENT DOCUMENTS 3,487,239 A    12/1969  Schafft
6,768,246 B2    7/2004  Pelrine
(Continued)

FOREIGN PATENT DOCUMENTS

EP      1035637 A3      2/2002
GB      2444093 A       5/2008
WO      2011/044901 A1  4/2011

OTHER PUBLICATIONS

Lo, H.C., et al., "Circuit Design Considerations for Regulating Energy Generated by Dielectric Elastomer Generators," Proceedings of SPIE, Electroactive Polymer Actuators and Devices (EAPAD) 7976:79760C-1-79760C-8, Mar. 2011.
(Continued)

*Primary Examiner* — Bickey Dhakal
*Assistant Examiner* — Zoheb Imtiaz
(74) *Attorney, Agent, or Firm* — Christensen O'Connor Johnson Kindness PLLC

(57) ABSTRACT

The invention relates to transformers. More particularly, the invention relates to transformers using (preferably electrostatic and more preferably dielectric elastomer) transducers such as generators and actuators. The invention further provides a priming circuit therefor.

19 Claims, 15 Drawing Sheets

(51) Int. Cl.
*H01L 41/107* (2006.01)
*H01L 41/193* (2006.01)

(56) References Cited

U.S. PATENT DOCUMENTS

| | | |
|---|---|---|
| 6,876,135 B2 | 4/2005 | Pelrine |
| 6,882,086 B2 | 4/2005 | Kornbluh |
| 7,034,432 B1 | 4/2006 | Pelrine |
| 7,368,862 B2 | 5/2008 | Pelrine |
| 7,977,923 B2 | 7/2011 | Pelrine |
| 2001/0035723 A1* | 11/2001 | Pelrine .................... F02G 1/043 318/116 |
| 2002/0008445 A1 | 1/2002 | Pelrine |
| 2002/0141213 A1* | 10/2002 | De Vries ............ H03K 17/0403 363/124 |
| 2002/0175594 A1 | 11/2002 | Kornbluh |
| 2006/0158065 A1* | 7/2006 | Pelrine .................. A61M 5/142 310/328 |
| 2007/0200457 A1 | 8/2007 | Heim |
| 2007/0257490 A1 | 11/2007 | Kornbluh |
| 2008/0218132 A1* | 9/2008 | Pelrine .................. H02N 2/181 322/2 A |

OTHER PUBLICATIONS

McKay, T., et al., "Electro-Active Polymer Power Generation," NERI '09 Conference: "Knowing More, Doing Better," National Energy Research Institute, Wellington, New Zealand, Apr. 16-17, 2009, 1 page.

Nef, T., and R. Riener, "ARMin—Design of a Novel Arm Rehabilitation Robot," Proceedings of the IEEE 9th International Conference on Rehabilitation Robotics, Chicago, Jun. 28-Jul. 1, 2005, pp. 57-60.

Pelrine, R.E., et al., "Electrostriction of Polymer Dielectrics With Compliant Electrodes as a Means of Actuation," Sensors and Actuators A: Physical 64(1):77-85, Jan. 1998.

Prahlad, H., et al., "Polymer Power: Dielectric Elastomers and Their Applications in Distributed Actuation and a Power Generation," Proceedings of ISSS, International Conference on Smart Materials Structures and Systems, Bangalore, India, Jul. 28-30, 2005, pp. SA-100-SA-107.

Supplementary European Search Report and European Search Opinion issued in corresponding European Application No. EP 10797357, dated Sep. 12, 2013, 4 pages.

International Search Report dated Oct. 27, 2010, issued in corresponding International Application No. PCT/NZ2010/000143, filed Jul. 7, 2010.

* cited by examiner

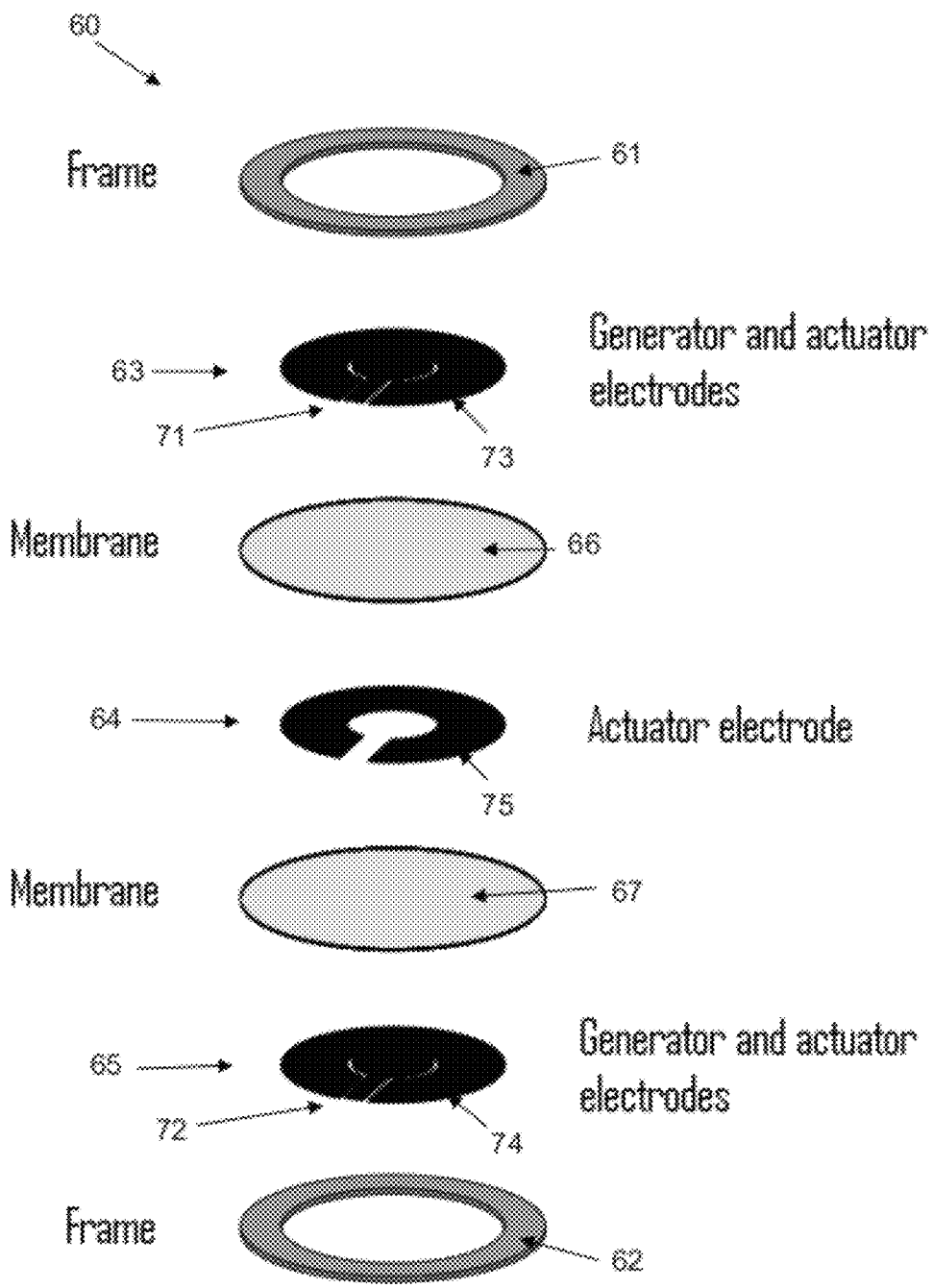

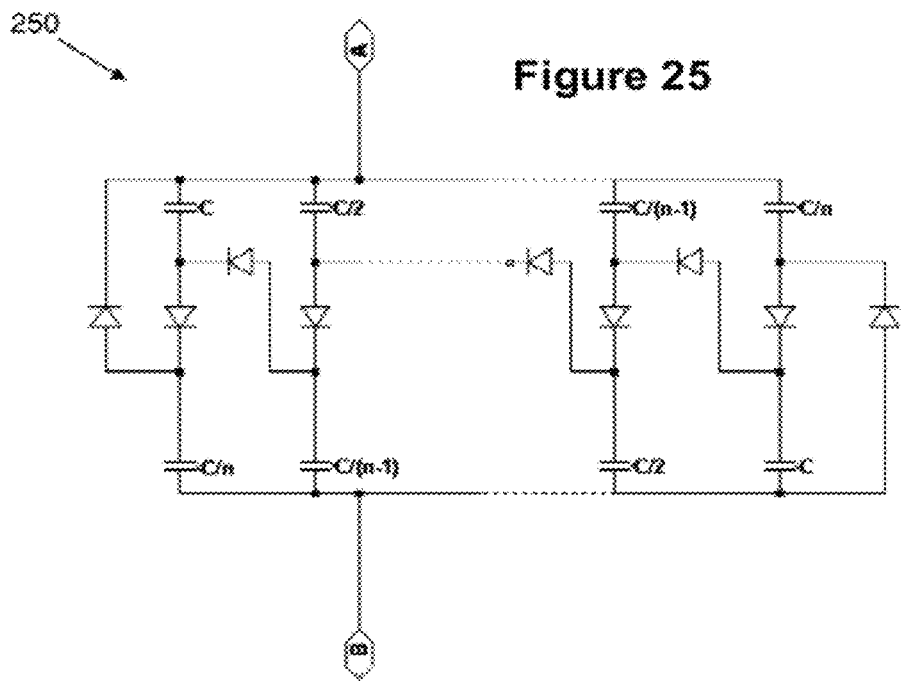
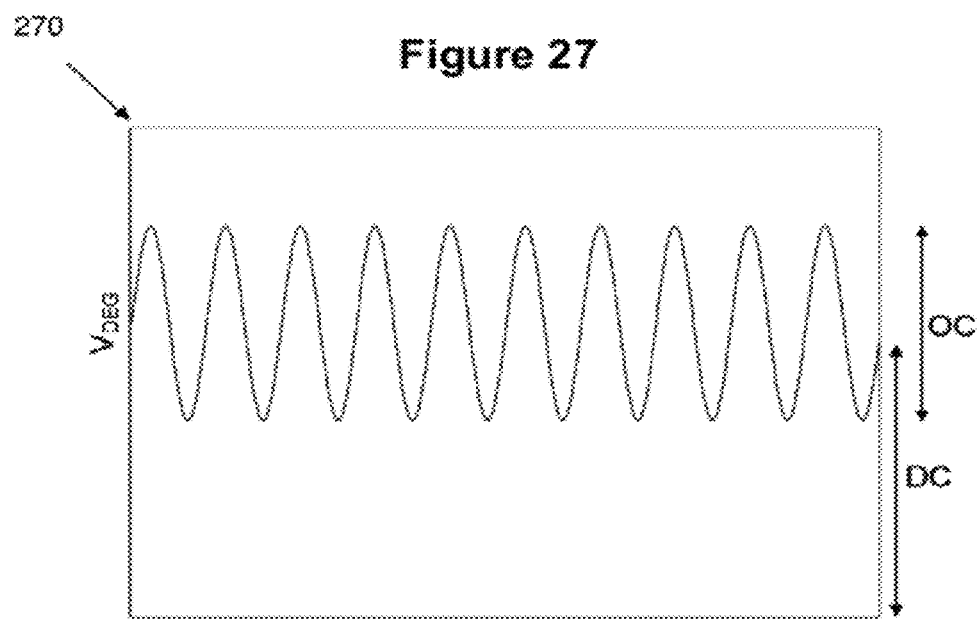

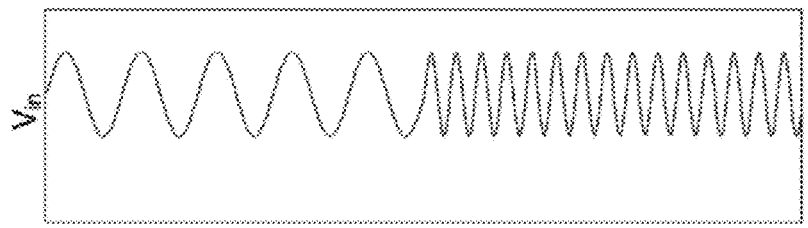
Figure 28
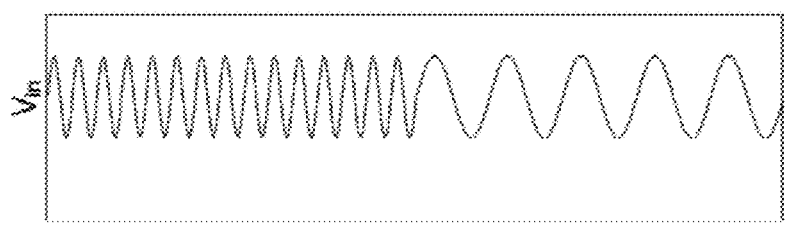
Figure 29
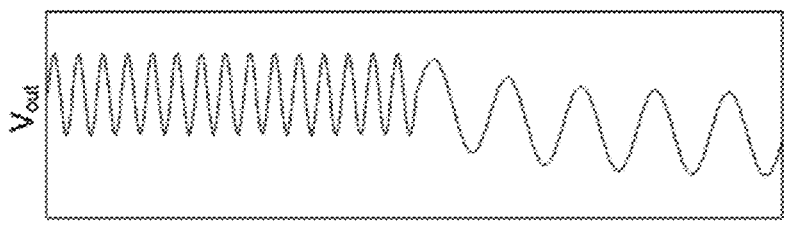

TRANSFORMER AND PRIMING CIRCUIT THEREFOR

FIELD OF INVENTION

The invention relates to transformers. More particularly, the invention relates to transformers using (preferably electrostatic and more preferably dielectric elastomer) transducers such as generators and actuators. The invention further provides a priming circuit therefor.

BACKGROUND TO THE INVENTION

An electro-active polymer (EAP) is a soft actuator that can generate high stress and large strain. A dielectric elastomer actuator (DEA) is an EAP which uses a dielectric elastomer film or membrane with a flexible electrode attached to each face. Application of a voltage difference across the electrodes generates Maxwell stress. The two electrodes are urged together by electrostatic attraction of free charges on the electrodes, causing the thickness of the membrane to decrease and the surface area of the faces to increase. This deformation is further caused by electrostatic repulsion of like charges on each individual face. Thus, application of a voltage to the electrodes causes the membrane to expand in area and compress in thickness.

A dielectric elastomer generator (DEG) is a class of electrostatic generator that is similar in configuration to a DEA except that it uses an EAP to convert mechanical energy into electrical energy. In principle at least, a DEG is essentially a DEA working in reverse.

Pelrine et al. in "Electrostriction of polymer dielectrics with compliant electrodes as a means of actuation", Sensors and Actuators A 64, 77-85 (1998) describe the basic principles behind DEAs and a linear actuator based thereon.

US Patent Application No. 2002/0008445 describes arrangements in which an electroactive polymer may be used in a transducer to convert electrical energy into mechanical energy by applying a voltage to electrodes contacting the electroactive polymer. The transducer may also be used to convert mechanical energy into electrical energy by mechanically deflecting the electroactive polymer.

For many years, electrical transformers operating using the principles of electromagnetic induction have been used to 'step up' or 'step down' voltage from one circuit to another. Electromagnetic transformers are known to be inefficient at certain, especially low, frequencies. They typically require metallic components and create magnetic 'noise', neither of which are desirable in some applications. Transformers have a characteristic 'humming' noise which may be undesirable.

Piezoelectric transformers are transformers which operate using the principles of piezoelectricity. In one form, piezoelectric transformers operate on the basis of acoustic coupling between input and output. By applying an input voltage to a piezoelectric material it can be made to vibrate and, at the appropriate frequency, resonate. A higher output voltage can therefore be generated at another section of the material.

In another form, such as discussed in U.S. Pat. No. 3,487,239, piezoelectric transformers consist of a motor portion and a generator portion. An electrical field applied to the former is converted into mechanical energy using the piezoelectric effect. The mechanical energy is input into the generator portion to convert the mechanical energy back into electrical energy, again by the piezoelectric effect.

Piezoelectric transformers are known to have several characteristics which are not always desirable, depending on the application. These include: low efficiencies; poor performance at low frequencies; limited to low amplitude applications; resonance problems; voltage drift if the transformer is run at low frequencies; and the production of only alternating current (AC) power.

OBJECT OF THE INVENTION

It is an object of the invention to provide an improved transformer, particularly a transformer using electrostatic transducers) such as generators and/or actuators, more preferably dielectric elastomer generators and/or dielectric elastomer actuators.

Alternatively, it is an object of the invention to provide an improved electrostatic transducer (more preferably a dielectric elastomer transducer) for use in a transformer.

Alternatively, it is an object of the invention to provide an improved self priming circuit for use in a transformer or generator.

Alternatively, it is an object of the invention to at least provide the public with a useful choice.

SUMMARY OF THE INVENTION

According to a first aspect of the invention, there is provided a transformer including:

a first (preferably electrostatic and more preferably dielectric elastomer) transducer for converting energy in a first form into energy in a second form; and a second (preferably electrostatic and more preferably dielectric elastomer) transducer for converting energy in the second form into energy in the first form, wherein the first and second transducers are coupled such that energy in the second form output by the first transducer is input in the second transducer.

Preferably, the first transducer receives an electrical input and provides a mechanical output. More preferably, the first transducer is a dielectric elastomer actuator (DEA). A DEA is a transducer that converts electrical energy into mechanical energy by means of a dielectric elastomer.

Preferably, the second transducer receives a mechanical input and provides an electrical output. More preferably, the second transducer is a dielectric elastomer generator (DEG). A DEG is a transducer that converts mechanical energy into electrical energy by means of a dielectric elastomer.

In a first form of the first aspect of the invention, electrical energy is preferably input to the first transducer and electrical energy is output by the second transducer. Preferably, the transducers are arranged such that electrical energy is input into the transformer and electrical energy is output by the transformer. The first form of the first aspect generally relates to an "electrical transformer", that is one which both receives as input and outputs electrical energy.

Preferably, the first and second transducers are mechanically coupled.

Preferably, the first and second transducers are mechanically coupled by way of at least one common membrane between the first and second transducers.

Preferably, the first and second transducers are mechanically coupled by a dielectric elastomer membrane of the first transducer being connected to a dielectric elastomer membrane of the second transducer.

Preferably, the first and second transducers are mechanically coupled by way of a common power shaft.

Preferably, the input voltage across the first transducer is different from the output voltage across the second transducer. Therefore, the transformer may 'step up' or 'step down' the input voltage by a known amount. Different amounts of changes in voltage may be achieved according to different properties of the system, such as elastomer thickness, elastomer material, the amount by which an elastomer is pre-stretched or amount of charge stored. These properties affect, for example, the relative amount of deformation of dielectric elastomer in the second transducer compared to the deformation of dielectric elastomer in the first transducer. Alternatively, the voltage gain or loss of the transformer may be increased or decreased by increasing or decreasing the frequency of oscillations input to a transducer, respectively. Other properties may be varied for other forms of transducer.

Preferably, the transformer includes a switching circuit or oscillatory power source adapted to periodically apply a voltage to the DEA.

In an alternative, second, form of the first aspect, mechanical energy is preferably input into the second transducer and mechanical energy is output by the first transducer. Preferably, the transducers are arranged such that mechanical energy is input into the transformer and mechanical energy is output by the transformer. The second form of the first aspect generally relates to a "mechanical transformer", that is one which both receives as input and outputs mechanical energy.

Preferably, the first and second transducers are electrically coupled.

Preferably, the second transducer receives a first deformation and the first transducer produces a second deformation. The transducer receives a deformation in the sense that a dielectric elastomer membrane is deformed when receiving an input of mechanical energy. This may be achieved by a displacement of a component of the transducer, for example.

Preferably, the first and second deformations are substantially identical.

Preferably, the first deformation has a first magnitude and the second deformation has a second magnitude. The first magnitude may be the same as, greater than or less than the second magnitude. The magnitudes may be a measure of the amount of deformation (e.g. a change in length) or associated force. Other measures will also be apparent.

Preferably, the first deformation is a linear deformation and the second deformation is a rotational deformation. Alternatively, the first deformation is a rotational deformation and the second deformation is a linear deformation.

Preferably, the transformer includes a bending actuator. The bending actuator may include a stretched dielectric elastomer membrane coupled to a flexible frame. The bending actuator may be rotationally deformed.

Preferably, the first deformation is an oscillatory deformation having a first frequency. More preferably, the second deformation is an oscillatory deformation having a second frequency. The first frequency may be the same as, greater than or less than the second frequency.

Other deformations will be apparent to those in the art and are included within the scope of the invention. For the avoidance of doubt, the first and second deformations may be the same or different.

The first aspect of the invention in its first and/or second form may include further features such as are described below in relation to the first and/or second form unless otherwise detailed. Moreover, substantially the same apparatus may be used for both forms and elements described in relation to one form may be applied to the other form without invention.

Preferably, the transformer includes a self priming circuit. More preferably, the electrical coupling between the first and second transducers is by way of the self priming circuit. More preferably, the self priming circuit is a self priming circuit according to the fifth aspect of the invention.

Preferably, the self priming circuit is provided in parallel with the DEG, DEA and a load.

Preferably, the transformer includes at least one dielectric elastomer of predetermined thickness and/or pre-stretched to a predetermined amount.

Preferably, the transformer includes at least one dielectric elastomer consisting of a dielectric material that is chosen to suit the particular application.

In one embodiment, the transformer preferably includes a DEA portion and a DEG portion.

Preferably, in the first form of the first aspect of the invention, the DEG portion is surrounded, at least in part, by the DEA portion. As will be appreciated, each portion may be formed from more than one dielectric elastomer body.

Preferably, the transformer includes three layers of electrodes. More preferably, top and bottom electrode layers include both DEA and DEG electrodes; middle electrode layer includes only DEA electrode(s).

Preferably, the transformer includes two dielectric elastomer membranes. One membrane may be positioned between the top and middle electrode layers and the other membrane between the middle and bottom electrode layers.

Preferably, the two dielectric elastomer membranes or bodies are coupled together through a gap in the middle electrode layer.

Preferably, the transformer is supported by a support frame.

In an alternative embodiment, the transformer preferably includes a first dielectric elastomer membrane positioned between a first outer, preferably annular, member and an inner member. More preferably, the membrane is stretched between the members.

Preferably, the inner member may be displaced relative to the outer annular member in a direction perpendicular to the plane of the membrane in a non-displaced state.

Preferably, a second dielectric elastomer membrane is positioned between a second outer annular member and an inner member.

Preferably, displacement of the inner member in a first direction causes the first dielectric elastomer membrane to stretch and the second dielectric elastomer membrane to relax. Displacement of the inner member in a second direction causes the second dielectric elastomer membrane to stretch and the first dielectric elastomer membrane to relax. In one embodiment, both first and second dielectric elastomer membranes form part of a DEG. Alternatively, the first dielectric elastomer membrane forms part of a DEA and the second dielectric elastomer membrane forms part of a DEG.

Preferably, the first dielectric elastomer membrane forms part of a DEA and the second dielectric elastomer membrane forms part of a DEG. In this embodiment, the DEA and DEG may be mechanically coupled according to the first form of the first aspect of the invention by connection of first and second dielectric elastomer membranes to a common inner member and the transformer is an electrical transformer.

Alternatively, the first and second dielectric elastomer membranes form part of a DEG. Preferably, in the second form of the first aspect of the invention, oscillations of a common inner member connected to both dielectric elastomer membranes create voltage outputs from each dielectric elastomer membrane that are 180° out of phase with each other. Preferably, the voltage outputs are input to a DEA to produce an oscillation having twice the frequency of oscillation of the common inner member. The amount of voltage gain or loss in the transformer can be increased or decreased by increasing or decreasing a driving frequency of oscillations input to the DEA, respectively.

According to a second aspect of the invention, there is provided an electrostatic (preferably dielectric elastomer) transducer for use in a transformer, the electrostatic transducer being for coupling to a further transducer, which is also preferably an electrostatic (more preferably, a dielectric elastomer) transducer.

In one preferred embodiment, the transducer is a dielectric elastomer actuator (DEA) adapted to be coupled to a dielectric elastomer generator (DEG). In an alternative preferred embodiment, the dielectric elastomer transducer is a dielectric elastomer generator (DEG) adapted to be coupled to a dielectric elastomer actuator (DEA).

In either preferred embodiment, the DEA or DEG may be adapted to be either mechanically coupled, in which case the transformer is an electrical transformer which receives and outputs electrical energy, or alternatively the DEA or DEG may be adapted to be electrically coupled, in which case the transformer is a mechanical transformer which receives and outputs mechanical energy.

Additional DEAs and/or DEGs may be provided as desired, operating in series or in parallel so as to obtain a desired output.

In an alternative preferred embodiment, the dielectric elastomer transducer is adapted to operate as a DEA and/or a DEG such that it can transform electrical energy into mechanical energy and/or mechanical energy into electrical energy. Thus, the transformer can transfer energy bidirectionally.

According to a third aspect of the invention, there is provided a method of transforming energy including:

converting energy in a first form into a second form (preferably in a first electrostatic transducer and more preferably in a first dielectric elastomer transducer);

converting energy in the second form into the first form (preferably in a second electrostatic transducer and more preferably in a second dielectric elastomer transducer); and coupling the first and second transducers such that energy in the second form output by the first transducer is input in the second transducer.

According to a fourth aspect of the invention, there is provided a transformer system including a plurality of transformers according to the first aspect of the invention or at least three transducers according to the second aspect.

Preferably, the plurality of transformers or transducers is used to achieve a gradual increase or decrease in voltage from one transformer to another in the plurality of transformers. The energy density of dielectric elastomers increases with electric field strength. However dielectric breakdown, a DE failure mode, is also field dependent (a thicker material can withstand a larger voltage than a thin one). By using a cascade of DET where the thickness increases, it is possible to drive consecutive DE at higher voltages.

Each transformer or transducer is operatively connected to at least one other transformer or transducer so as to receive at least a portion of the energy generated by at least one transformer or transducer and/or transfer energy to at least one transformer or transducer. It will be noted that where an odd number of transducers are arranged in series, the output energy will be in a different form to that input.

According to a fifth aspect of the invention, there is provided a self priming circuit for an electrostatic generator and/or a transformer for an electrostatic generator, the circuit including means for controlling a priming charge on the electrostatic generator to maintain or increase or decrease the priming charge. For example, the circuit may enable the generator to work against losses in the system and/or a load.

Preferably, the means for controlling is in the form of a reverse charge pump that includes a plurality of capacitors and a plurality of diodes, wherein the capacitors and diodes are arranged such that the circuit has a capacitance when current flows in a first direction greater than the capacitance of the circuit when current flows in a second direction.

To avoid doubt, the self priming circuit of the invention is not limited to use with dielectric elastomers.

Preferably, the transformer or generator includes a dielectric elastomer generator (DEG).

Preferably, the capacitance of the circuit is greater when current is flowing towards the DEG.

Preferably, the plurality of diodes are arranged such that at least two of the plurality of capacitors are effectively in parallel with each other when current flows in the first direction (into the DEG) and effectively in series when current flows in the second direction (out of the generator).

Preferably, when current flows in the first direction the circuit is in a high charge, low voltage configuration. Preferably, when current flows in the second direction the circuit is in a low charge, high voltage configuration.

Preferably, the self priming circuit is adapted to be adjustable such that the structure of the circuit can be selected according to the required application of the circuit.

The self priming circuit may be used to generate a frequency controlled gain of the electrical transformer of the invention and/or enable the mechanical transformer of the invention to be used without, or with a more limited, external power source, as will become more apparent herein below. More particularly, according to preferred embodiments, the self priming circuit uses some of the input mechanical power to maintain the priming charge on the generator to enable the generator DEG to work against losses in the system and loads without the need for additional, external electrical energy to be added.

According to a sixth aspect of the invention, there is provided a transformer including:

An electrostatic (preferably dielectric elastomer) generator for converting energy in mechanical form into energy in electrical form; and an actuator for converting energy in electrical form into energy in mechanical form, wherein the generator and the actuator are coupled such that energy output by either the generator or the actuator is input in the other of the generator or the actuator.

In a first form of the sixth aspect, the generator and actuator are mechanically coupled. Preferably, mechanical energy output by the actuator is input in the generator. Preferably, electrical energy is input in the transformer and electrical energy is output by the transformer. This is generally referred to as a "electrical transformer", that is one which both receives as input and outputs electrical energy.

In a second form of the sixth aspect, the generator and actuator are electrically coupled. Preferably, electrical energy output by the generator is input in the actuator. Preferably, mechanical energy is input in the transformer and mechanical energy is output by the transformer. This is generally referred to as a "mechanical transformer", that is one which both receives as input and outputs mechanical energy.

According to a seventh aspect of the invention, there is provided a method of transforming energy including:

converting energy in a first form into a second form in a first (preferably electrostatic and more preferably dielectric elastomer) transducer;

converting energy in the second form into the first form in a second (preferably electrostatic and more preferably dielectric elastomer) transducer; and coupling the first and second transducers such that energy output by one is input in the other.

Preferably, the first form is mechanical and the second electrical.

Further aspects of the invention, which should be considered in all its novel aspects, will become apparent to those skilled in the art upon reading the following description which provides at least one example of a practical application of the invention.

BRIEF DESCRIPTION OF THE DRAWINGS

One or more embodiments of the invention will be described below by way of example only, and without intending to be limiting, with reference to the following drawings, in which:

FIG. 7 is a perspective exploded view of the transformer of FIG. 6;

FIG. 25 is a circuit diagram of a self priming circuit according to a yet still further embodiment of the invention;

FIG. 27 is a schematic of a typical voltage output waveform of a DEG at steady state;

FIG. 28 is a schematic of the voltage input and output of a DE transformer where the input frequency is increased;

FIG. 29 is a schematic of the voltage input and output of a DE transformer where the input frequency is decreased;

DETAILED DESCRIPTION OF PREFERRED EMBODIMENTS OF THE INVENTION

In broad terms, the invention provides a transformer having at least one electrostatic transducer. Energy is provided to the transformer in a first form (namely by deformation of or applying a voltage across at least one body). Through selection of couplings (mechanical and/or electrical) between the bodies and the properties and numbers thereof, a desired transformation can be achieved. Preferably, the transformation results in the output of energy in the first form but having a different property.

In the following description, transformers according to the invention will be described. By way of example, preferred embodiments are described which include two dielectric elastomer transducers; typically an actuator and generator. The invention also encompasses transformers including a dielectric elastomer generator and more generally any actuator (i.e., including non-dielectric elastomer-based actuators). The actuator may be a dielectric elastomer actuator or another type of actuator, such as an electromagnetic or piezoelectric actuator. After reading the following description it will be apparent to those skilled in the art how the invention can be performed using any actuator. Such embodiments can be useful in enabling the actuator to be driven at low voltages.

Also, embodiments of the invention may additionally or alternatively include one or more non-dielectric elastomer-based generators, depending on the requirements of a particular implementation.

Further, references herein to "dielectric elastomer" are to be interpreted broadly as including any electrostatic-based transducer. Thus, the embodiments described are by way of example only and are non-limiting.

Figure 1:
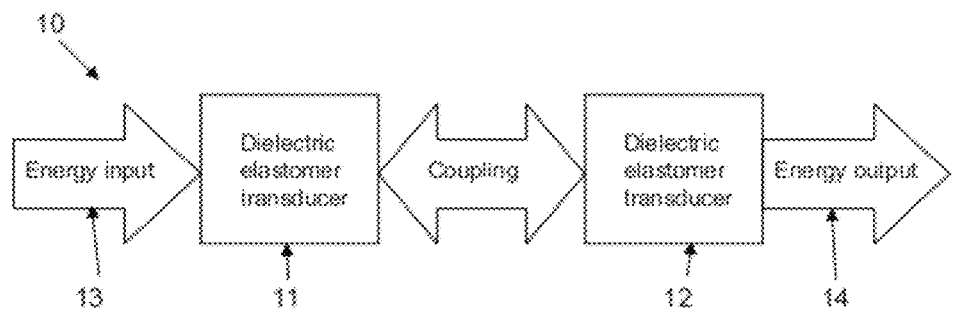
FIG. 1 is a schematic illustration of a transformer of one embodiment.

FIG. 1 is a schematic illustration of a transformer 10 according to the invention. The invention relates generally to a transformer 10 including two dielectric elastomer transducers 11 and 12, the two transducers being coupled such that energy output from a first transducer is input into the second. The first transducer 11 converts input energy 13 from a first form into a second form and the second transducer 12 converts energy from the second form back into the first form to be output from the transformer as output energy 14. One possible effect of the transformer is therefore to output energy in the same form as that input, but with a change in a property of the form of energy. Alternatively the output is identical to the input, isolating the input from the output and/or transmitting energy from remote locations. As will be appreciated, each transducer 11, 12 may include one or more dielectric elastomer bodies, or one or more zones of one or more such bodies, working in series or parallel. Also, each transducer 11, 12 may be made up of more than one transducer operating in series or in parallel. Alternatively, the transformer may include a single dielectric elastomer body having at least one zone or region acting as a first transducer and at least one zone or region acting as a second transducer. Examples are discussed further in the embodiments described below.

Figure 2:
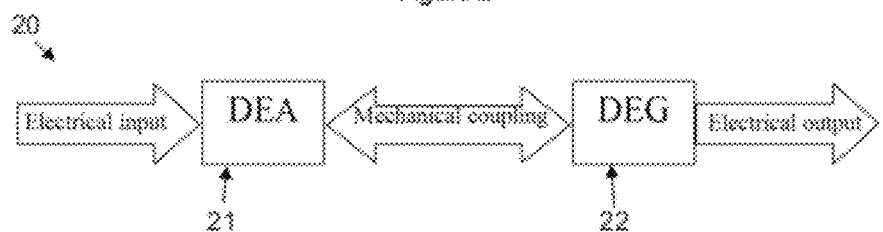
FIG. 2 schematically shows an electrical transformer of one embodiment.
Figure 3:
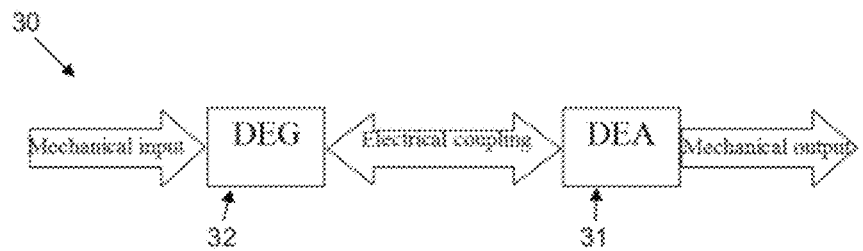
FIG. 3 schematically shows a mechanical transformer of one embodiment.

Two alternative preferred embodiments of the invention are illustrated schematically in FIGS. 2 and 3. FIG. 2 is a schematic illustration of an electrical transformer 20 according to an embodiment of the invention. FIG. 3 is a schematic illustration of a mechanical transformer 30 according to another embodiment of the invention. In this document, the term 'electrical transformer' refers to a transformer which receives as an input and outputs electrical energy and the term 'mechanical transformer' refers to a transformer which receives as an input and outputs mechanical energy. Both electrical transformer 20 and mechanical transformer 30 include two dielectric elastomer transducers: one dielectric elastomer actuator (DEA) 21 or 31 and one dielectric elastomer generator (DEG) 22 or 32 although additional DEAs and/or DEGs may be added. Dielectric elastomer transducers such as DEAs and DEGs are well-known in the art and embodiments of the present invention may incorporate any such transducers; the invention is not dependent on the type of dielectric elastomer transducers, DEAs, DEGs, or equivalent transducers, used therein.

Both electrical transformer 20 and mechanical transformer 30 require coupling between the DEA and DEG. The way in which the DEA and DEG are coupled is dependent on whether the transformer is an electrical transformer or a mechanical transformer, as will be described further below. Essentially, for an electrical transformer, a mechanical coupling is required so that one dielectric elastomer body directly or indirectly deforms another, whereas for a mechanical transformer, an electrical coupling is required whereby electrical energy from a DEG is passed to a DEA.

Figure 4:
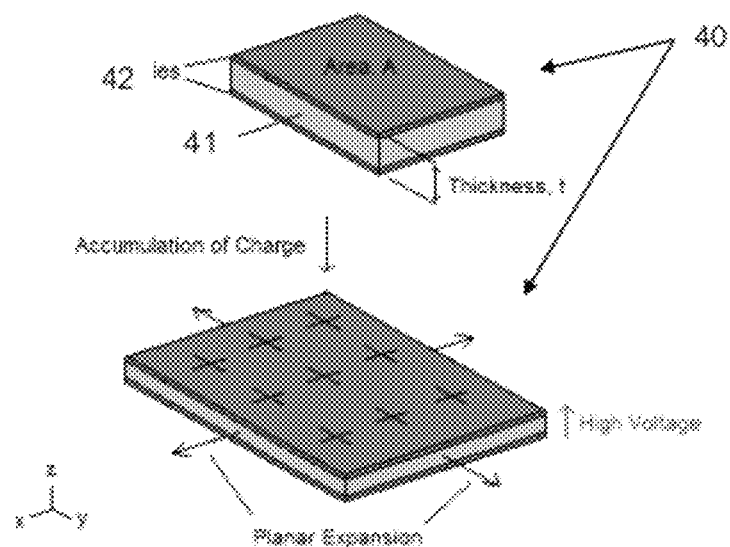
FIG. 4 is a schematic illustration of a known dielectric elastomer actuator.

As shown in FIG. 4, a dielectric elastomer actuator (DEA) 40 may consist of soft dielectric material 41 coated with compliant electrodes 42. On application of a high voltage between the electrodes (out of plane), electrostatic attraction between charges accumulated on the surface electrodes causes the electrodes to be squeezed together. At the same time, like charges on each electrode repel each other (in plane). The attraction and repulsion forces act together to transform the DEA such that its thickness is reduced and its length and width are increased since it is incompressible. Thus, on actuation, the actuator deforms from the first configuration in the upper diagram in FIG. 4 in which the actuator has a thickness t and surface area A to the second configuration in the lower diagram in which the actuator has a reduced thickness and a larger surface area.

Figure 5:
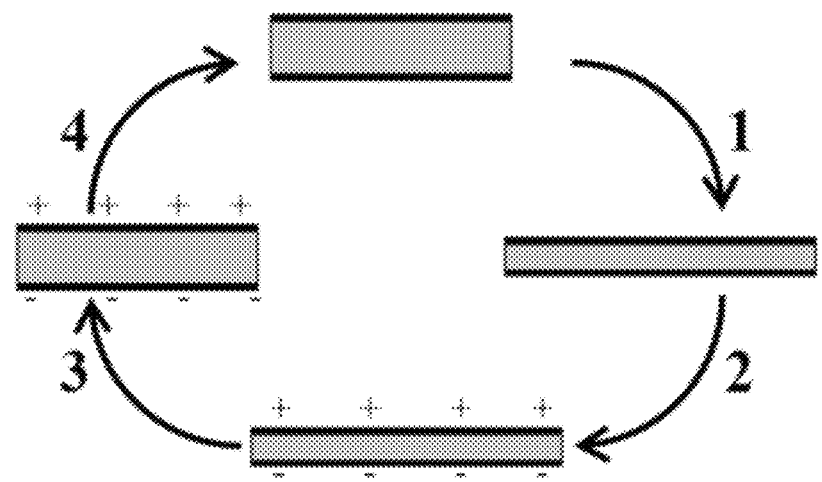
FIG. 5 is a schematic illustration of a known dielectric elastomer generator generation cycle.

FIG. 5 illustrates a dielectric elastomer generator (DEG) during four stages of a generation cycle. The DEG has the same physical structure as DEA 40 illustrated in FIG. 4. In the first stage, the DEG is deformed to a state in which it has an increased surface area and decreased thickness. In the second stage, the DEG is charged to a bias voltage. In the third stage, the mechanical deformation of the DEG is relaxed, while the amount of charge is kept constant. In this step, the distance between opposite charges is increased and like charges are packed more densely, thus increasing the potential energy per charge. In the fourth stage of the cycle, the charge is drained to an electrical load.

In transformer 20 illustrated in FIG. 2, electrical energy is provided as an input to DEA 21. DEA 21 converts the electrical energy into a form of mechanical energy. The nature of the mechanical energy is dependent on the particular DEA used, although typically this energy will be embodied in the form of motion. For example, mechanical energy in the form of linear motion is produced by a linear actuator and mechanical energy in the form of rotary motion is produced by a rotary actuator. Other types of mechanical motion may be known and are included within the scope of the invention.

DEA 21 is mechanically coupled to DEG 22 such that at least a portion of the mechanical energy output by DEA 21 is an input to DEG 22. The nature of the mechanical coupling is dependent on the form of DEA and DEG used and some non-limiting examples of the way in which this coupling may be achieved are described below in relation to preferred embodiments. Other methods of mechanically coupling DEA 21 and DEG 22 will be evident to those of ordinary skill in the art.

DEG 22 receives mechanical energy which is output from DEA 21 either directly or indirectly by means of the mechanical coupling between DEG 22 and DEA 21. DEG 22 converts the mechanical energy into electrical energy.

The effect of electrical transformer 20 is therefore to both receive and output electrical energy, while transforming it to mechanical energy in the process. In a preferred embodiment of the invention, the properties of the electrical energy output by electrical transformer 20 are different to that of the electrical energy input to the electrical transformer, although this is not necessarily so. Properties of the electrical energy which may be changed by the transformer include voltage; current; and frequency. For example, the transformer may 'step up' or 'step down' the voltage.

It should be noted that in the energy transformations disclosed herein there will be energy losses and efficiencies as will be known to those of skill in the art. The invention does not suggest that all of the energy input to a transducer (such as a DEA or DEG) is converted and output as energy in another form. Typically it is desirable that the efficiency of a transducer be as close to unity as possible, although a transformer with any degree of efficiency is included within the scope of the invention.

Turning now to mechanical transformer 30 illustrated in FIG. 3, DEG 32 receives incident energy in the form of mechanical energy, for example as kinetic energy embodied in linear and/or rotational motion resulting in a first deformation of a first dielectric elastomer membrane. DEG 32 converts the mechanical energy into electrical energy, which is output (although it is understood that not all of the mechanical energy will be converted since losses will occur), for example in the form of motion or a second deformation of a second dielectric elastomer membrane.

DEG 32 is electrically coupled to DEA 31 such that the electrical energy output by DEG 32 is input to DEA 31. The nature of the electrical coupling is dependent on the form of DEA and DEG used and some non-limiting examples of the way in which this coupling may be achieved are described below in relation to preferred embodiments. Other methods of electrically coupling DEA 31 and DEG 32 will be evident to those of ordinary skill in the art. Essentially, all that is required is that at least a portion of the electrical energy generated by DEG 32 is transferred to DEA 31.

DEA 31 receives electrical energy which is output from DEG 32 either directly or indirectly by means of the electrical coupling between DEG 32 and DEA 31. DEA 31 converts the electrical energy into mechanical energy.

The effect of mechanical transformer 30 is therefore to both receive and output mechanical energy, while transforming it to electrical energy in the process. Advantageously, mechanical transformer 30 therefore allows two bodies to be coupled without being mechanically in contact with another. Thus, the motion of two bodies may be linked with only an electrical coupling between them. The properties of the mechanical energy output by electrical transformer 30 may be different to that of the mechanical energy input to the mechanical transformer, although in other embodiments the properties may be the same. Properties of the mechanical energy which may be changed by the transformer include direction of motion or deformation; type of motion or deformation, such as linear and/or rotational; frequency of oscillation; and form of mechanical energy.

It should be noted that, while not shown, DEA 21 and/or DEA 31 may include more than one DEA, preferably configured to work in parallel, and/or DEG 22 and/or DEG 32 may include more than one DEG configured to work in parallel. In other words, one or more transducers arranged in parallel may pass energy to one or more transducers in parallel.

There will now be described particular embodiments and applications of the invention in both mechanical transformer and electrical transformer forms as hereinbefore described.

Figure 6:
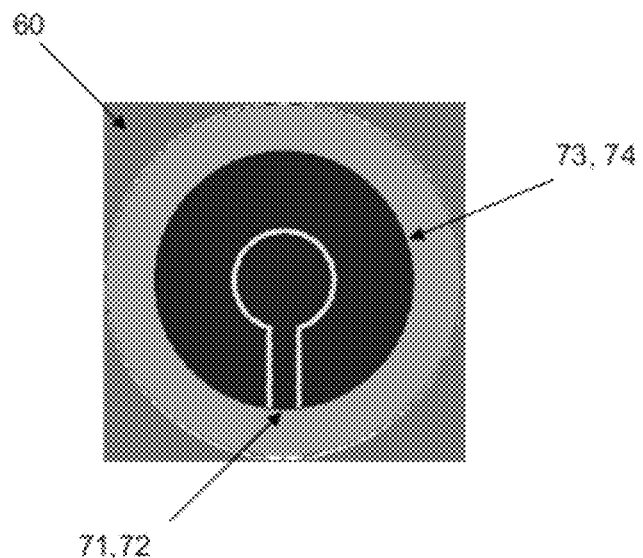
FIG. 6 is a plan view of an electrical transformer of one embodiment.

FIGS. 6 and 7 are views of an electrical transformer 60 according to an embodiment of the invention. FIG. 6 is a plan view of electrical transformer 60 and FIG. 7 is a perspective exploded view of the same transformer.

Referring in particular to FIG. 7, transformer 60 includes top and bottom support frames 61 and 62 in the form of annuli or rings. The transformer also includes three electrode layers 63, 64 and 65. Each pair of electrode layers has a dielectric elastomer membrane in between: membrane 66 is between electrode layers 63 and 64; membrane 67 is between electrode layers 64 and 65.

The diameters of the electrode layers are of a size such that the electrodes fit within the annuli of the top and bottom support frames. Membranes 66 and 67 have diameters substantially equal to the outer diameter of the support frame annuli. The relative dimensions in this arrangement are for exemplary purposes and other embodiments may have a different configuration.

Both top electrode layer 63 and bottom electrode layer 65 include two zones or regions, electrically isolated from each other in a known manner. Each zone represents a separate electrode. First zones 71 and 72 include an inner circular portion and second zones 73 and 74 consist of an outer annulus portion encircling the inner circular portion of the respective first zone. The size and relative positioning of the zones in the top and bottom electrode layers 63 and 65 is the same.

In the embodiment shown, first zones 71 and 72 also include a radial portion. Second zones 73 and 74 co-operatively include a gap which allows the radial portion to electrically connect an external component to the inner portion of the first zone. This portion may be made as narrow as possible to reduce the effects of the first zone electrodes on the second zone and that other ways of providing an electrical connection to the inner circular portion of the first zone are possible. Middle electrode layer 64 includes only an outer zone electrode 75 of corresponding shape to the second zone electrodes of the top and bottom electrode layers.

The first zones 71 and 72 form electrodes of a DEG portion of the transformer and the second zones 73 and 74, along with the outer zone electrode 75, form electrodes of a DEA portion of the transformer.

When a voltage is imparted across the pairs of electrodes in the DEA portion of the transformer, the portions of the two membranes in between these electrodes, i.e. the portion of the membranes in the DEA portion, expand as a result of the properties of dielectric polymers. In the expansion, the area of the DEA portion increases while the thickness decreases. As the DEA portion expands in area, the DEG portion, which is the inner portion surrounded by the DEA portion, contracts in area. The thickness of the DEG portion is therefore increased and a voltage is produced between the electrodes of the DEG portion—i.e. between first zone electrodes 71 and 72.

The compressive force between electrodes with a larger separation is lower than that between electrodes having a smaller separation. Therefore the DEA portion of the transformer, which is, for example, twice as thick as the DEG portion, expands even if the voltage across the DEG portion is greater. Due to the in this case doubled thickness of the membrane between the DEG electrodes compared to the DEA electrodes there is therefore a voltage gain. In other embodiments, different amounts of increased or decreased thicknesses may be provided between DEA and DEG portions, resulting in a correspondingly different amount of voltage gain or loss.

In a preferred embodiment, membranes 66 and 67 are coupled together through the hole in middle electrode layer 64, for example by adhering membrane 66 to membrane 67 through the gap in electrode 75. Without this coupling, an air gap is effectively present in the DEG, decreasing the capacitance across the DEG electrodes and therefore decreasing the amount of electrical energy it supplies.

The voltage across the electrodes is removed by means of a switching circuit and the membranes contract to their previous rest states. The switching circuit then causes the voltage to be periodically applied again and the cycle repeats.

The mechanical coupling between the DEA and DEG in this embodiment is by way of common membranes shared between the DEA and DEG. In the embodiment discussed below, the DEA and DEG are mechanically coupled by way of the dielectric elastomer membrane of the DEA being connected, either directly or indirectly, to that of the DEG.

Figure 8:
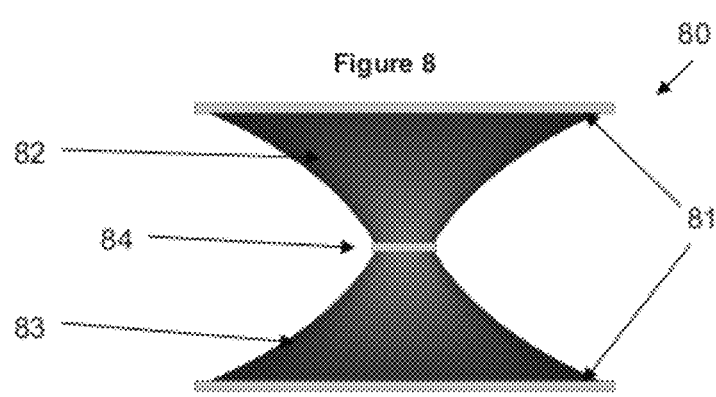
FIG. 8 is a schematic illustration of an electrical transformer according to an embodiment of the invention in a non-deformed state.

FIG. 8 illustrates an alternative embodiment of an electrical transformer 80. Electrical transformer 80 includes rigid frame 81 and two sheets of stretched dielectric elastomer 82 and 83. The two sheets are joined by a rigid member 84. The sheets of stretched dielectric elastomer have electrodes positioned on upper and lower sheets respectively, such that top sheet 82 acts as a DEA and bottom sheet 83 acts as a DEG.

Figure 9:
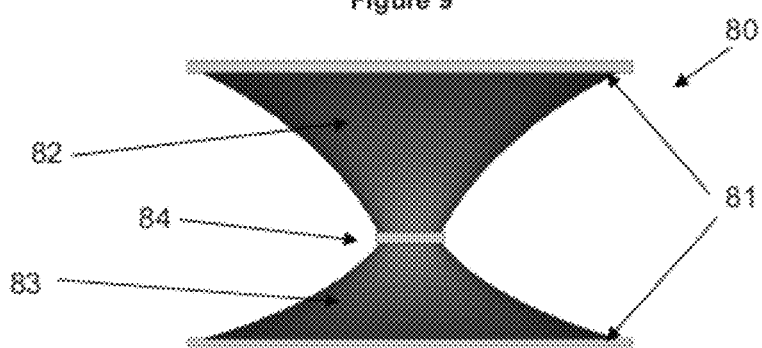
FIG. 9 schematically shows the transformer of FIG. 8 in a deformed state.

Actuation of DEA 82 produces a deformation in DEG 83 as shown in FIG. 9. Provided the DEA and DEG are not identical, a voltage gain is produced across the DEG compared to the input voltage to the DEA. Different properties of the DEG may be varied compared to the DEA to produce the voltage gain, including: surface area; thickness or number of layers; type of dielectric elastomer material; degree of pre-stretching. A transformer producing a predetermined level of voltage gain, for example, has predetermined properties such as elastomer thickness and degree of pre-stretching of elastomer, such that the transformation achieved is known. These parameters may be varied to produce different amounts of voltage gain, as will be understood to those of skill in the art. Alternatively, the voltage gain can be adjusted by altering the frequency and/or magnitude of the voltage waveform input to the system. Thus a gain greater than 1 is possible if the DEA and DEG are identical. Also, the gain can be adjusted on the fly by altering the input waveform (variable gain transformer). This is discussed in detail below.

The above embodiments discuss examples of electrical transformers in which a voltage gain or 'step up' in voltage is achieved. It will be understood by those of skill in the art that electrical transformers according to the invention could equally be configured to decrease or 'step down' voltage by a suitable change to the system, such as elastomer properties.

There are now discussed mechanical transformers according to embodiments of the invention.

Figure 10:
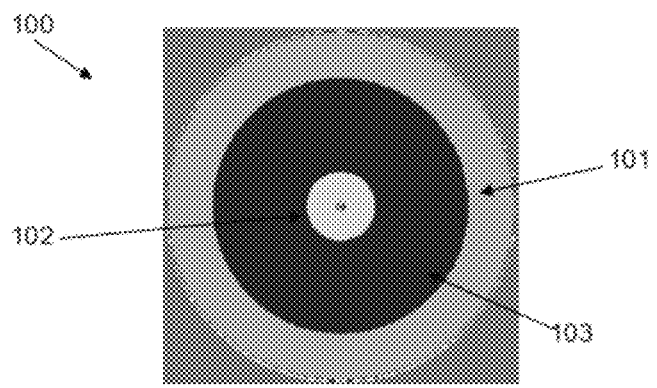
FIGS. 10-12 show a plan view, a side view in a deformed state and a side view in a non-deformed state, respectively, of a dielectric elastomer generator.

FIG. 10 illustrates a plan view of a DEG 100, which is included in a mechanical transformer according to an embodiment of the invention. The same DEG is shown in side view in FIGS. 11 and 12. DEG 100 includes an outer annular member 101, an inner member 102 and a dielectric elastomer membrane 103 stretched between them. Inner member 102 may be displaced in a direction perpendicular to the plane of the membrane when in a non-displaced state. When the inner member is displaced, the membrane deforms.

Figure 11:
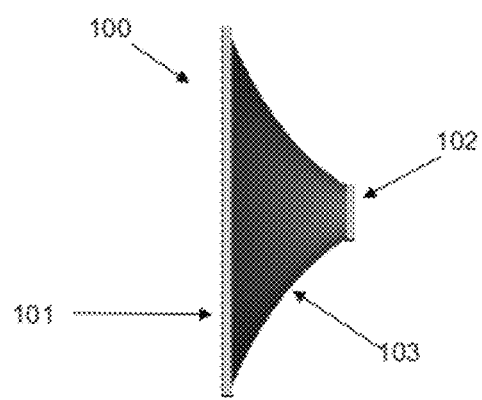
Figure 12:
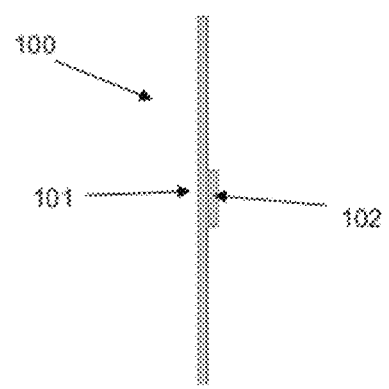

In FIG. 11, DEG 100 is shown in a mechanically displaced or deformed state and in FIG. 12 in a mechanically un-deformed state.

Figures 13, 14:
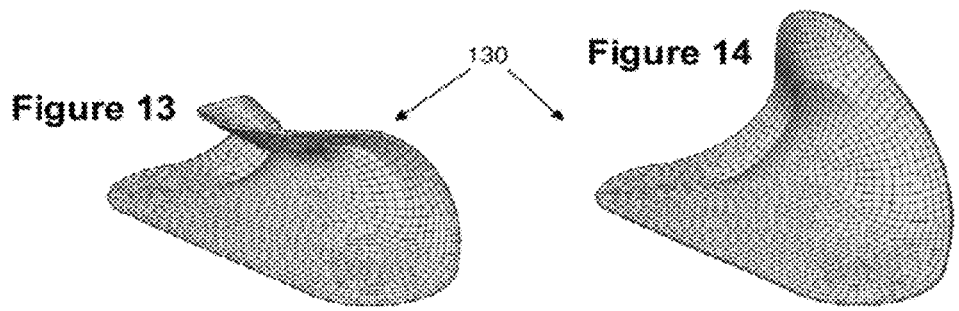
FIG. 13 is an illustration of a known dielectric elastomer minimum energy structure which is part of a dielectric elastomer actuator according to an embodiment of the invention.
FIG. 14 is an illustration of the dielectric elastomer membrane of FIG. 13 in an actuated state.

DEG 100 is connected by electrical circuitry to a DEA, such as DEA 130 illustrated in FIG. 13. DEA 130 is a bending actuator. As is known in the art, a bending actuator is a type of dielectric elastomer minimum energy structure, consisting of pre-stretched dielectric elastomer membranes adhered to a flexible frame. The tension in the membrane causes the frame to bend until the bending energy in the frame is equal to the strain energy in the DEA and the structure is at equilibrium. When DEA 130 is actuated, the energy state of the membrane is changed, so the frame bends to a different position.

When DEG 100 is mechanically deformed, for example by input of a repeating linear force to cause inner member 102 to move back and forth, an oscillating voltage is produced across DEG 100. By electrical coupling to the electrodes of DEA 130 via the electrical coupling circuitry, the voltage across the electrodes of DEA 130 causes the dielectric elastomer membrane of DEA 130 to bend. The DEA therefore moves between the position shown in FIG. 13 and that shown in FIG. 14. As such, the mechanical transformer in this embodiment transforms linear mechanical motion to bending motion via an electrical coupling.

Figure 15:
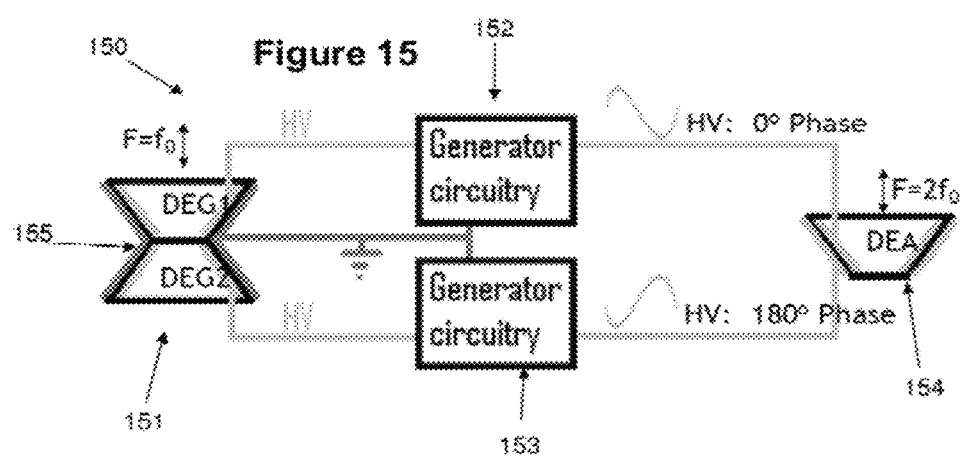
FIG. 15 schematically shows a mechanical transformer of one embodiment.

FIG. 15 illustrates a mechanical transformer 150 according to another embodiment of the invention. Mechanical transformer 150 includes DEG 151 which includes two individual DEGs labelled DEG1 and DEG2. DEG1 and DEG2 each consist of a sheet of dielectric elastomer stretched between an inner member and an outer annular frame member, the inner member being common between DEG1 and DEG2. The outer annular frame members are maintained at a predetermined distance from one another such that, in a passive state the inner member is positioned halfway between the outer annular frame members with the elastomer sheets stretched between them. Electrodes are situated on the upper and lower surface of each of the elastomer sheets.

As shown in FIG. 15, the electrodes of DEG1 and DEG2 are both connected to generator circuitry 152 and 153. Further description of generator circuitry 152 and 153 is provided below. The generator circuitries are connected to electrodes of DEA 154, which is essentially identical to DEG1 or DEG2.

In use, an oscillatory force is provided to inner member 155 of DEG 151. Inner member 155 therefore oscillates back and forth with a frequency $f_0$. During the oscillation of inner member 155, when DEG1 is being stretched, DEG2 is relaxed and vice versa. Therefore, DEG1 and DEG2 produce signals with voltages 180° out of phase with each other, as shown schematically in the Figure.

The electrical output from DEG1 is applied to the top electrode and the electrical output from DEG2 is applied to the bottom electrode of DEA 154. The result is a voltage across DEA 154 which oscillates at a frequency $2f_0$. The voltage across the electrodes of DEA 154 causes the dielectric elastomer to deform accordingly and therefore, DEA 154 is caused to mechanically oscillate at twice the frequency of the input oscillation.

It will be understood by those of skill in the art that different changes in oscillatory frequency may be achieved and that the frequency may decrease, increase or stay the same between input and output of a transformer according to the invention.

As will be understood, the transformer according to the invention may include any known transducer in combination with any other known transducer as an alternative arrangement to those discussed herein. Those skilled in the art will be familiar with alternative transducer arrangements, such as actuators and generators. For example, other known forms of DEAs include crank-driven rotary actuators in which application of voltage to a dielectric elastomer membrane causes a crank-shaft to rotate, which in turn rotates a drive shaft. Such a system is described in U.S. Pat. No. 6,084,321, the contents of which are incorporated herein by reference. A similar construction may be used in reverse as a rotary DEG.

A rotary DEA and a rotary DEG may be coupled either electrically or mechanically as a transformer according to an embodiment of the invention. For an electrical transformer, the DEA and DEG are mechanically coupled, for example, by a common power shaft. For a mechanical transformer, the DEA and DEG are electrically coupled by circuitry similar to that described in relation to other embodiments of the invention. As will be understood, different levels of voltage gain and different types of mechanical transformation may be obtained by varying such parameters as the size or thickness of dielectric elastomer membrane used, the amount of stretching of membrane.

A still alternative form of transducer that may be used as part of the invention is a spring roll actuator/generator, which will be known to those skilled in the art. Spring roll arrangements use a coiled dielectric elastomer membrane and enhance energy density as compared to a planar dielectric elastomer. For example, a spring roll generator may be electrically coupled to a spring roll actuator in a mechanical transformer arrangement.

Another form of mechanical coupling that may be used as part of the invention is coupling using gears. Using different form of gear arrangements the amount of voltage gain or frequency change in the electrical energy may be changed as will be understood.

Other dielectric elastomer and/or frame arrangements including stacked elastomer membranes may be selected depending on, for example, space requirements as well as the operating characteristics of energy transformation.

Transformers according to the invention may be lighter, more efficient and cheaper than equivalent existing transformer technologies, especially for low frequency use. The transformers described herein can respond to a wide range of frequencies and thus provide an improvement on existing products. The transformers can be constructed with no magnetic or metallic components and therefore may be used in harsh environments with large magnetic fields or where magnetic fields are undesirable. For example, they may be suitable for use in Magnetic Resonance Imaging (MRI) systems or an environment with a low tolerance to magnetic noise. Transformers may be constructed according to the invention with a substantially flat geometry, providing for increased versatility of use and simplified construction compared to traditional transformers.

The transformers described herein are capacitive in nature so they are able to store energy for later use. It has been found in particular that the use of silicones in the dielectric elastomers increase their mechanical efficiency and allow them to hold charge for an increased length of time. In mechanical transformers it is particularly advantageous to use high voltage electrical couplings in order to keep the current as low as possible and reduce power ($I^2R$) losses. Electrical transformers according to the invention may be operated at inaudibly low frequencies therefore reducing the amount of 'humming' associated with conventional transformers. Experimentally, it has been found that efficiencies of up to 90% are possible using DEGs. Using DEAs, efficiencies can be increased by slowly increasing the voltage instead of connecting the DEA straight to a battery. It is thought that efficiencies could approach approximately 90% using such a method. In a mechanical transformer, the voltage across the DEA slowly oscillates, so high DEA efficiencies are expected. Overall, the efficiencies of dielectric elastomer transformers could potentially improve on efficiencies of conventional transformers.

The limitations of dielectric elastomer membranes include the fact that the membrane will break down, for example by physically tearing, at or above a certain value of electric field through the membrane, known as the breakdown electric field. This limitation may also limit the amount of voltage transformation that a dielectric elastomer could produce. To overcome this problem, preferred embodiments of the invention use a stepped voltage transformation or multi-stage transformers such that a plurality of transformers, where the thickness of the DE throughout the cascade may vary, are used in combination and the voltage is increased or decreased in gradual steps from one transformer to the next. Since electric field in a dielectric elastomer is proportional to the voltage difference across it, the overall voltage can be stepped up or down while staying within the limits of the breakdown electric field.

There will now be discussed particular applications envisaged for embodiments of transformers according to the invention. These applications are exemplary and do not limit use of the invention to these embodiments. Transformers according to the invention may have further applications not discussed herein.

Mechanical transformers according to the invention may have application anywhere where the motion of two bodies needs to be coupled together but particularly where no mechanical coupling is desired between them and/or a change in the motion is desired, including the amount of force. The bodies may undergo different strokes at different frequencies. It is envisaged that the heaving motion of waves could be converted into higher frequency flappers for driving a boat.

Figure 15A:
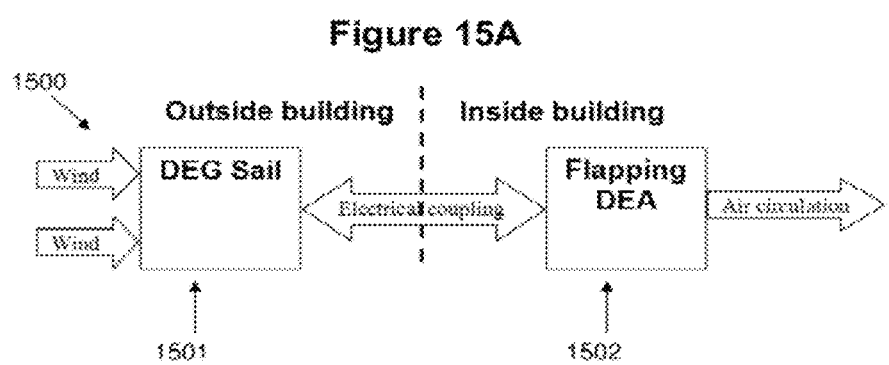
FIG. 15A is a schematic illustration of a mechanical transformer according to an embodiment of the invention used in a building ventilation system.

One possible application of a mechanical transformer according to the invention is illustrated in FIG. 15A. In the figure is shown a mechanical transformer 1500 which is used with a building ventilation system. Transformer 1500 converts the mechanical energy of wind into the movement of air inside a building. DEG 1501 includes sails formed at least partly from dielectric elastomer material which are moved by the wind and create electrical energy as a result. DEG 1501 is electrically coupled to DEA 1502 which has dielectric elastomer membranes which, when actuated, move air within the building. Thus wind energy is harnessed to circulate air inside the building or ventilate the building. In one embodiment, the interior of the building is substantially isolated from outside so that noise and pollutants do not enter the building.

Since the DEG and DEA do not need to be in close proximity, a large distributed array could be controlled by a single mechanical transformer. For example, control flaps on a glider could be electrically coupled together such that when one flap moved the other would also move. The transformer couples the motion of the flaps together without any external control. Much lighter weight could be achieved compared to mechanical or hydraulic linkages and dielectric elastomers are capable of large shape changes, whereas traditional systems are generally rigid, one benefit of which is that they may be configured to fit in a desired space/geometry.

Another envisaged application is in a rehabilitation device where a person with a nerve injury can transform movements from a full functioning limb to identical movements in an injured limb to retrain the brain how to control it.

Since both a DEA and DEG are capable of storing energy and of self priming, the transformer can accumulate boosts in voltage from previous cycles if desired, accumulating energy for future use. One application may therefore be in relation to autonomous robotics, where energy can be harvested from a vibration source and transformed into mechanical movement at a later time, without having to convert between high and low voltages.

A mechanical transformer according to the invention may be used as a sensor, for example in soft interface haptics. Another example would be to place the DEG in a remote location and movement or force feedback of the coupled DEA component could be used to gauge vibrations in the remote location. Such a sensor could monitor vibration in a structurally unsound mine, for example. Also, a mechanical transformer lends itself to surgical applications. Large motions could be transformed to small, fine motions (e.g. the motion of placing a rope through a hoop could be transformed to the fine motions required to thread a needle). As an example, the invention may be adapted for use in surgical applications (e.g. when inserting a metal implant into bone), and further configured to provide force feedback as discussed in relation to FIGS. 32 and 33.

Electrical transformers according to the invention may be readily manufactured and avoid complicated components. When rectified, electrical transformers may be approximated to DC transformers and they are also capable of producing very high voltages. Therefore, cheap, lightweight HVDC (high voltage direct current) transformers may be produced with a variety of applications, such as in an offshore wind farm where converting the power to HVDC decreases transmission losses.

If an electrical transformer according to an embodiment of the invention is excited at a high enough frequency, the output voltage will increase over time. This property could be used to produce sparks at intervals regulated by the transformers operational frequency. Alternatively, a variable gain transformer could be produced.

Both electrical and mechanical transformers may be suitable for space applications due to their inherent environmental tolerance. Since they are made of flexible materials, they may be transported in reasonably a compact form.

There is now provided a description of electrical circuitry used in embodiments of the invention in which the transformer acts as a mechanical transformer.

A DEG is essentially a variable capacitor power generator device. To generate electrical power, the electrodes of a DEG are first charged to a bias voltage and then deformed so that the opposite charges are separated and like charges are forced closer to each other. This deformation adds electrical energy to the charges, increasing the voltage across the electrodes.

An energy reservoir or capacitor bank may be used to supply the bias voltage. Methods of doing this include:
1. Permanently connecting the DEG to a battery to supply the bias voltage. The DEG effectively increases the amount of energy the battery can supply. The battery needs to be replaced or recharged after it has been drained of energy.
2. The bias voltage is supplied by a capacitor bank and when the DEG generates power, charge is returned to the capacitor bank. In a theoretical system with no losses, the total amount of charge in the system remains constant and it is transferred to the DEG which increases its energy and then returns it back to the charge reservoir.

In reality, no circuit components are ideal and therefore charge is lost from the system. Therefore the problem is to convert the increase in voltage into an increase in charge to overcome the losses. Methods of doing so using a charge pump working in reverse, so that electrical energy is converted to a lower voltage, higher charge form, will now be explained.

Figure 15B:
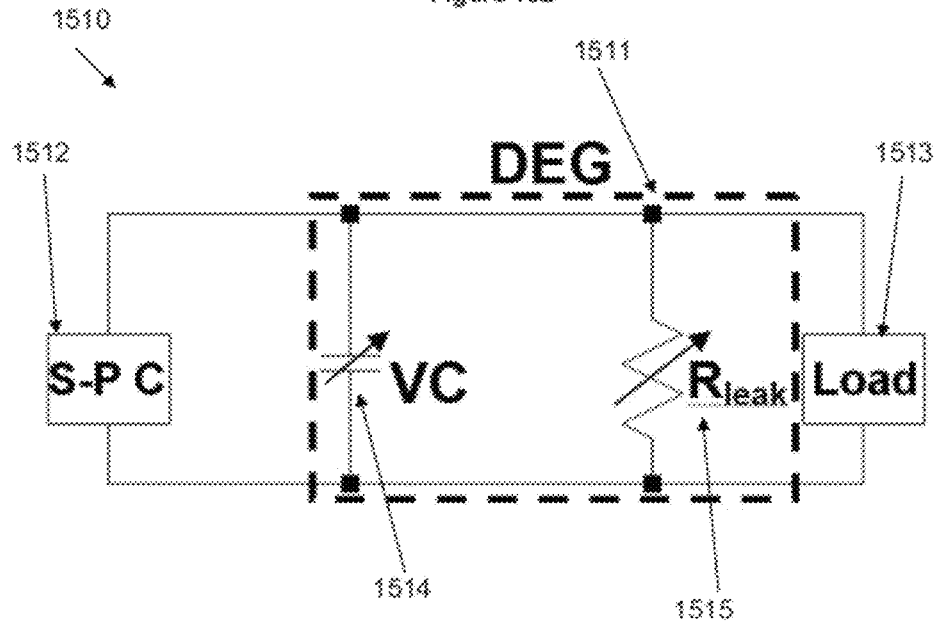
FIG. 15B is a diagram of a circuit according to an embodiment of the invention.

FIG. 15B is a diagram of a circuit 1510 according to an embodiment of the invention including a DEG 1511 and a self priming circuit (S-P C) 1512. DEG 1511 is connected in parallel with S-P C 1512 and a load 1513. DEG 1511 can be viewed as equivalent to a variable capacitor (VC) 1514 with a resistor ($R_{leak}$) 1515 in parallel through which VC 1514 loses charge. The charge leakage increases with voltage across DEG 1511.

Figure 16:
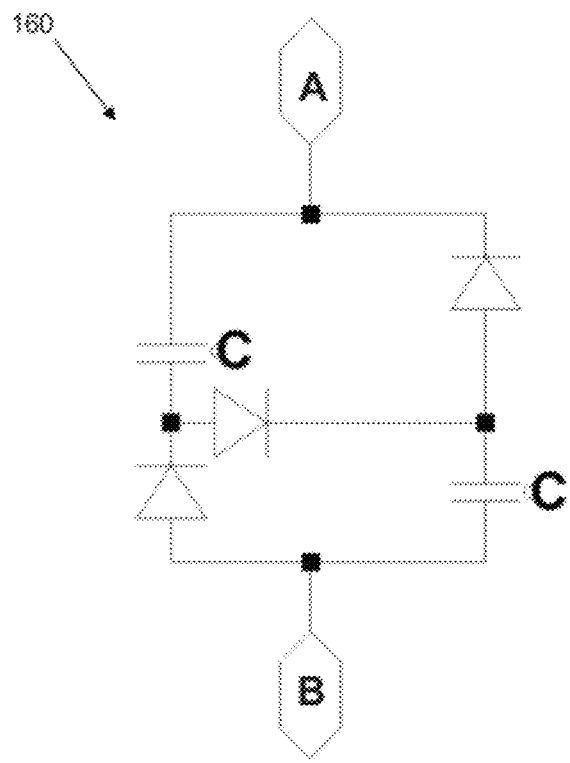
FIG. 16 shows a self priming circuit of one embodiment.

FIG. 16 is a circuit diagram of a self priming circuit 160 according to an embodiment of the invention. Self priming circuit 160 includes two capacitors of capacitance C and three diodes arranged as illustrated. When a capacitor bank supplies a priming voltage to a DEG, current flows from node B to node A. When current flows in this direction, because of the diodes the capacitors are effectively arranged in parallel as far as current flow is concerned, meaning the energy is in a high charge, low voltage form. To transfer energy back from the DEG to the capacitor bank, current flows in the direction of node A to node B. When current flows in this direction, the arrangement of the diodes means the capacitors are effectively in series, meaning the energy is in a high voltage, low charge form. However, one characteristic of this circuit is that the proportional change in voltage produced by the DEG needs to be higher than the proportional change in the voltage across the capacitor bank when it changes from the parallel state to the series state. In the embodiment illustrated in FIG. 16 with the two capacitors having the same capacitance, the voltage needs to double for the system to self prime.

Figure 17:
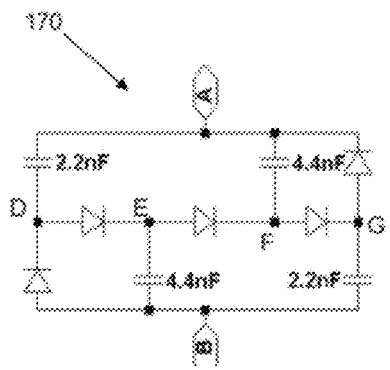
FIG. 17 shows a self priming circuit of one embodiment.
Figure 18:
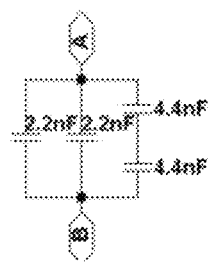
FIG. 18 shows the self priming circuit of FIG. 17 in a particular configuration.
Figure 19:
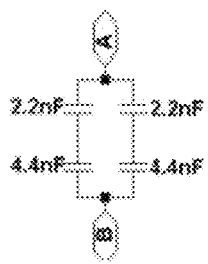
FIG. 19 shows the self priming circuit of FIG. 17 in another configuration.

FIG. 17 is a circuit diagram of a self priming circuit 170 according to another embodiment. The circuit again contains a plurality of capacitors and a plurality of diodes in the arrangement shown and works in similar fashion to that described above in relation to FIG. 16. When the capacitor bank is supplying the DEG, current flows from node B to node A, and in this case the equivalent circuit is shown in FIG. 18. When energy is transferred back to the capacitor bank and current flows from node A to node B, the equivalent circuit is shown in FIG. 19. Since the capacitors are already charged when the current is flowing from node B to node A, current does not flow from node D to node E or from node F to node G, because the latter are at higher potentials and current only flows down a potential gradient. In this case the voltage only needs to increase by 50%, because the proportional change in capacitance is less than in the embodiment shown in FIG. 16.

While FIGS. 17-19 (and 34C) show particular capacitance values of 2.2 nF and 4.4 nF, it will be appreciated that the invention is not limited thereto. These values may at least more generally be termed as C and 2C, respectively.

In the embodiments shown in FIGS. 16 and 17, one set of capacitors in a capacitor bank are placed in series with each other and that group is placed in parallel with the rest of the capacitor bank to boost the charge stored. To reduce the required swing in DEG voltage, the proportional change in the capacitor bank's capacitance needs to be reduced. Further embodiments which can achieve smaller proportional changes will now be described.

Figure 20:
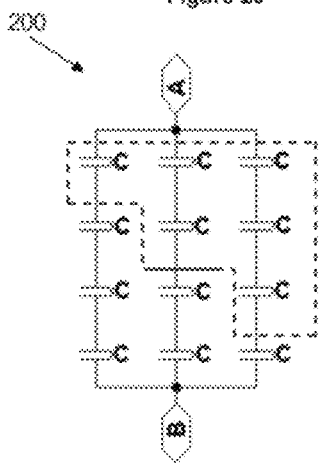
FIG. 20 shows a self priming circuit in a particular configuration.
Figure 21:
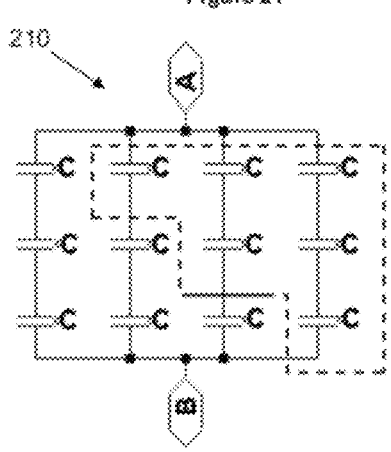
FIG. 21 shows the self priming circuit of FIG. 20 in another configuration.

FIGS. 20 and 21 are circuit diagrams illustrating an approach to a self priming circuit according to a further embodiment of the invention. In this approach, the capacitor bank includes two staggered groups of capacitors, one group being shown enclosed in a dotted line in the Figures. The group of capacitors enclosed in the dotted line can be shifted between two configurations; configuration 200 shown in FIG. 20 and configuration 210 shown in FIG. 21. Configuration 200 represents a higher voltage, lower charge configuration and configuration 210 represents a lower voltage, higher charge configuration.

Figure 23:
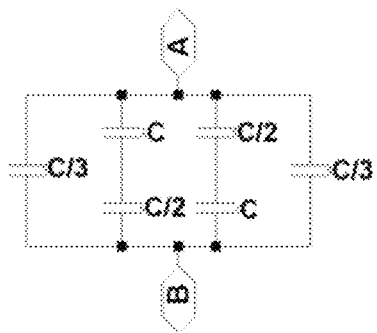
FIG. 23 shows the self priming circuit of FIG. 22 in a particular configuration.
Figure 24:
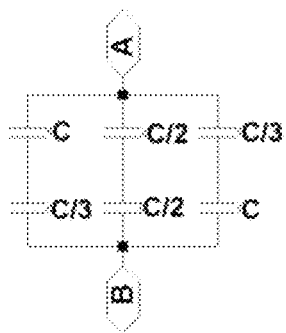
FIG. 24 shows the self priming circuit of FIG. 22 in another configuration.
Figure 22:
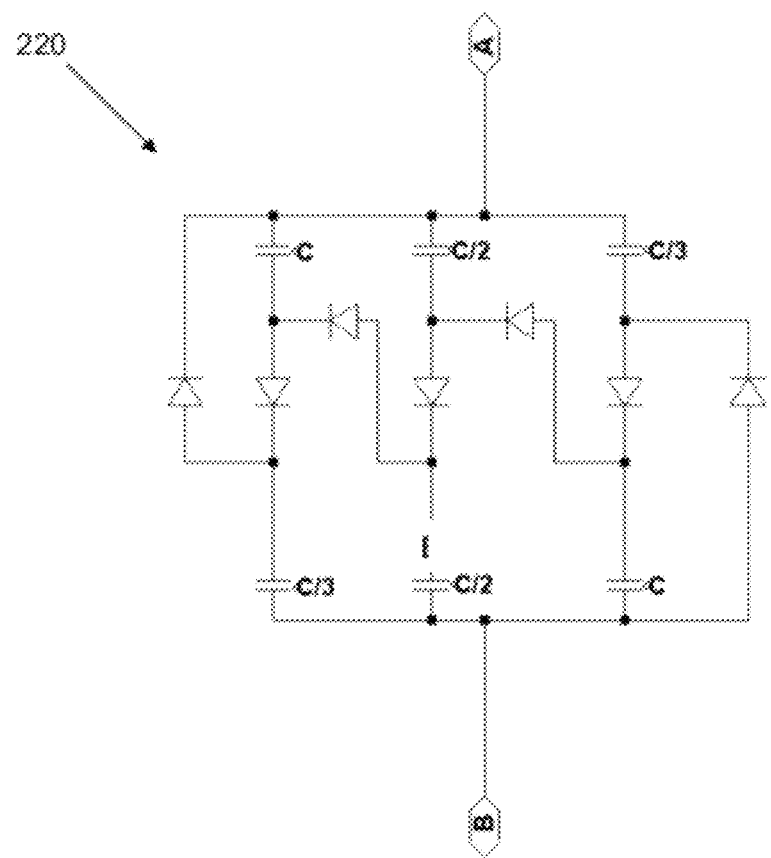
FIG. 22 shows a self priming circuit of a further embodiment.

FIG. 22 is a circuit diagram of a self priming circuit 220 according to an embodiment of the invention. Self priming circuit 220 uses the principle illustrated in FIGS. 20 and 21 and enables the circuit to effectively shift between the two configurations through the use of diodes connected according to the circuit diagram. Current flows from node B to node A when the capacitor bank supplies the priming voltage to a DEG. FIG. 23 illustrates the effective arrangement of capacitors when current flows in this direction. The energy is in a high charge, low voltage form. To transfer energy back to the capacitor bank from the DEG, current flows from node A to node B and the capacitors have the effective arrangement shown in FIG. 24. In this instance the energy is in a high voltage, low charge form. In this embodiment of the self priming circuit, the proportional change in capacitance is lower than in the previous embodiments. The required increase in DEG voltage is now 33%.

FIG. 25 is a circuit diagram of a general self priming circuit 250 according to an embodiment of the invention. The required percentage voltage swing $\%\Delta V_{DEG\_min}$ can be reduced by increasing the number of units in the capacitor bank according to the equation:

$$\%\Delta V_{DEG\_min} = \frac{100}{n}.$$

Self priming circuit 250 may be used with a DEG or transformer such that the circuit is optimised or at least selected according to the required application of the circuit. In this embodiment, control circuitry can be included to adjust the structure of the self priming circuit such that the number of capacitors included in the self priming circuit can be varied, for example, by switching capacitors in or out of the circuit.

Self priming circuits as described herein advantageously allow a DEG to run without being constantly connected to a power source. Also, DEGs have been able to be self primed from 2V up to the kV range, thus overcoming the need for expensive DC-DC converters required with conventional dielectric elastomer circuitry.

Figure 26:
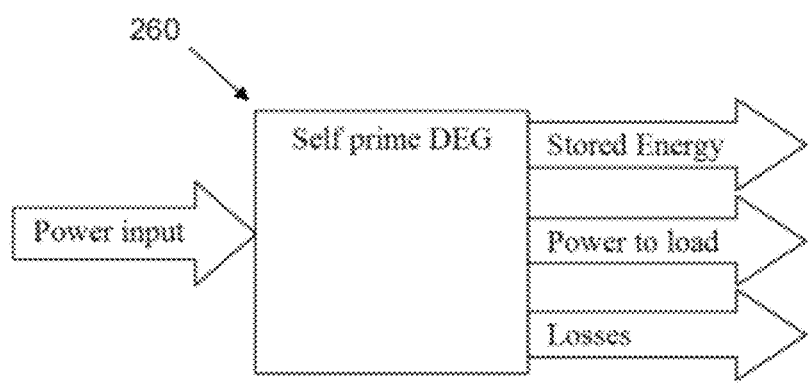
FIG. 26 is a schematic diagram of energy flow in a self priming DEG system.

FIG. 26 is a schematic diagram of energy flow in a self priming DEG system 260. Electrical and mechanical power is input to the system and electrical power is taken out of the system by the load and losses. The remaining energy may be stored in or taken from the self priming circuit's capacitor bank. The amount of power lost due to charge leakage decreases with voltage. The voltage gain of the system is dependent on the energy stored in the self priming circuit. It will approach a steady state where the power input is balanced by the power to the load and losses.

FIG. 27 is a graph 270 of the voltage output from a DEG. The output has an oscillating component, labelled 'OC', and a DC offset component, labelled 'DC'. The amplitude of the oscillating component OC is dependent on how much geometric change the DEG undergoes and the magnitude of the DC component. The DC component is dependent on how much energy is stored in the associated self priming circuit. The DC component can be boosted by increasing the frequency and/or magnitude of the DEG deformations or by decreasing the energy drawn by the load.

FIG. 28 illustrates how the voltage gain of an electrical dielectric elastomer transformer can be increased by increasing the driving frequency of the DEA component. Increasing the DEA driving frequency increases the amount of power input to the DEG. A hypothetical voltage waveform driving the DEA component of an electrical transformer is given in graph 281. When the driving frequency increases the voltage output from the mechanically coupled DEG increases, as shown in graph 282, because additional energy is stored in the self-priming circuit.

FIG. 29 illustrates how the voltage gain of an electrical dielectric elastomer transformer can be decreased by decreasing the driving frequency of the DEA component. Decreasing the DEA driving frequency decreases the amount of power input to the DEG. A hypothetical voltage waveform driving the DEA component of an electrical transformer is given in graph 291. When the driving frequency decreases the voltage output from the mechanically coupled DEG decreases, as shown in graph 292, because the load and losses drain more power from the self priming circuit than the power input to the DEG.

Figure 30:
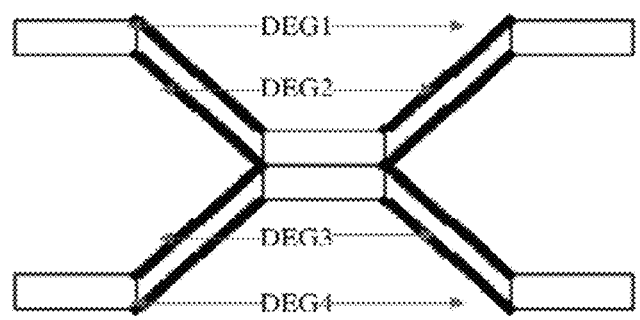
FIG. 30 shows a system having a pair of DEGs for use in a self priming circuit.
Figure 31:
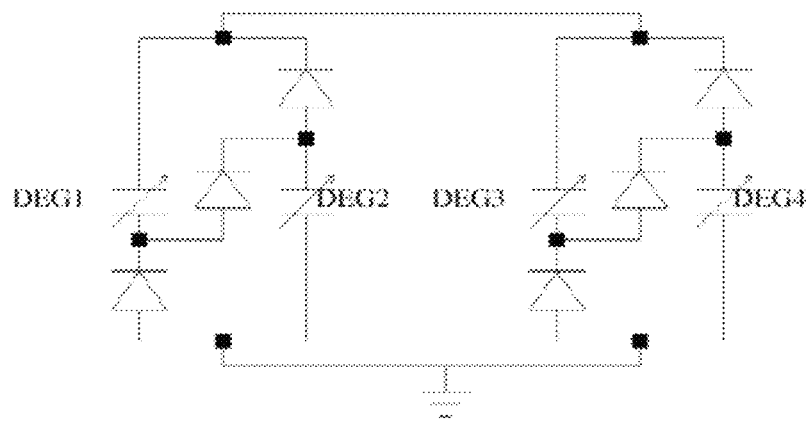
FIG. 31 shows a self priming circuit for use in the system of FIG. 30.

FIG. 30 illustrates a system where 2 pairs of DEG are operated 180 degrees out of phase. FIG. 31 is a schematic of a circuit that can utilise this configuration so that the capacitor bank of the self-prime circuit consists of DEG instead of fixed value capacitors. If the self-prime circuit DEG are deformed 180 degrees out of phase from the other DEG, the required voltage swing on each DEG reduces, Also, in this configuration, the capacitors in the self priming circuit are active (i.e., they also generate power), and there is no need for the extra capacitor bank (lighter system possible).

Figure 32:
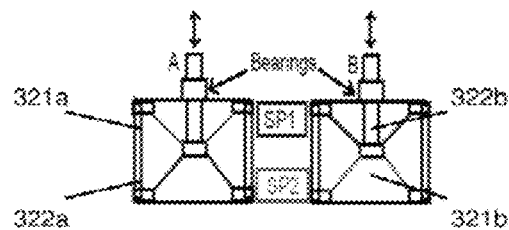
FIGS. 32,33 schematically show how force feedback may be provided.

FIG. 32 is a schematic diagram of an arrangement illustrating how haptic feedback may be generated. The arrangement includes two transformers. The first transformer includes DE 321a electrically coupled to DE 321b via self priming circuit SP1. The second transformer includes DE321b electrically coupled to DE 321b via self priming circuit SP2. Thus, the transformers of FIG. 32 are "mechanical transformers", as defined herein. Note that the device on the left side of the Figure including DEs 321a, 322a may be located remote from DEs 321b, 322b since they only need to be electrically coupled.

In the FIG. 32 arrangement, as one plunger is pushed down, the other also moves downwards. This can be used to transmit force and position information between the two plungers providing a low cost, lightweight and effective means of controlling remote manipulation.

Figure 33:
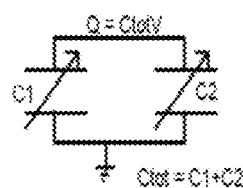

FIG. 33 shows a schematic circuit corresponding to one of the transformers of FIG. 32. The other transformer may have essentially the same circuit but only one is shown. The circuit essentially includes first and second variable capacitors C1, C2. If C1 is increased (such as by a user pressing plunger A downwards), then, if C2 is free to change, C2 will change to keep the charge in the system constant (i.e., the user will feel no force feedback) but if C2 is held constant, then changing C1 changes the total capacitance in the system resulting in a raised voltage and force feedback to the user.

The embodiment of FIGS. 10-12 was used to demonstrate the capabilities of a self priming circuit. The DEG consisted of a VHB4905 acrylic membrane pre-stretched equibiaxially to an area stretch of 9 and adhered to a Perspex outer ring with an inner diameter of 110 mm. An inner Perspex hub of diameter 70 mm was adhered to the centre of the membrane. This hub was used for coupling the DEG to a mechanical load which deformed it out of plane as illustrated in FIG. 11. Nyogel 756G carbon grease electrodes were brushed onto the membrane.

Figure 34A:
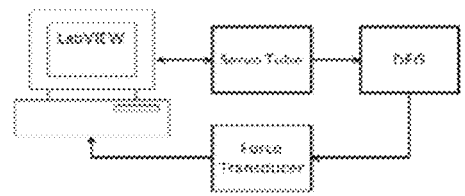
FIGS. 34A-F show an experimental setup, work curves, a schematic circuit diagram, voltage output against time for a self priming DEG operating in voltage boost mode, generated electrical energy per cycle against priming voltage, and power generation efficiency against priming voltage, respectively.

A schematic diagram of the test platform is illustrated in FIG. 34A. A force transducer (an oscillating ram coupled to inner Perspex hub) deformed the DEG. The amount of force required to do so was measured. The DEG was initially primed and the voltage it delivered to a high impedance load was measured. Control was effected using a single LabVIEW program which was also used to acquire the experimental data. This data was used to measure the amount of mechanical work delivered to the DEG and the amount of electrical energy transferred to the load.

Figure 34B:
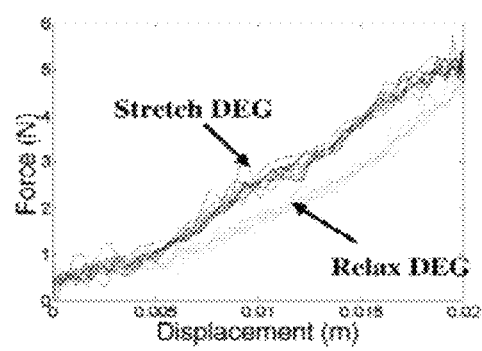

A Copley Controls STB2504S servo tube was used to deform the DEG between the planar and deformed states (see FIGS. 11 and 12). The inner hub was sinusoidally cycled between displacements of 0 and 20 mm from the planar state at frequencies of 2, 3, 4, and 5 Hz. The force to deform the DEG was measured using an interface SM-50N load cell. The amount of mechanical work (W) delivered to the DEG was calculated using the following equation:

$$W = \int_{T0}^{T} F(t) u'(t) dt$$

where F(t) is the force exerted on the DEG and u'(t) is the velocity at which the inner hub was displaced. Since the DEG was cyclically loaded, this form of the work integral was used as it gives only the amount of mechanical work used by the system (i.e., it excludes the work that was elastically restored). With reference to FIG. 34B, the force displacement data for the DEG deformed at 2 Hz, this integral is the area between the work curves for stretching and relaxing the DEG.

Figure 34C:
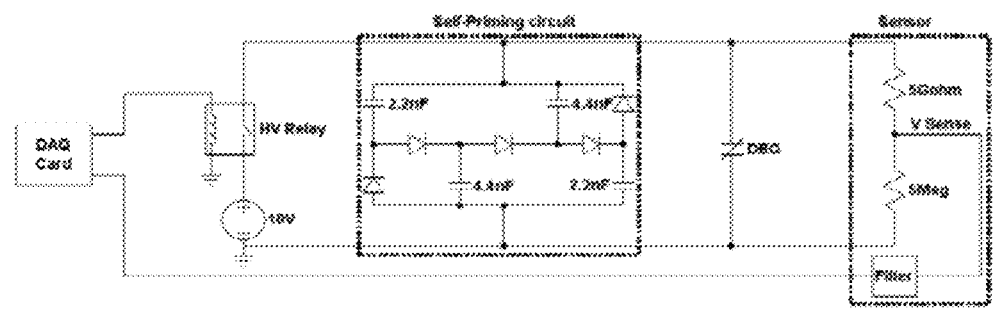

A schematic circuit diagram for the arrangement is provided in FIG. 34C. As can be seen, the self priming portion of the circuit is the same as the circuit of FIG. 17. A Powertech MP-3087 power supply was used to prime the DEG system to an initial voltage of 10 Volts. When the force transducer was triggered, the DEG system was disconnected from the power supply using a dry reed relay (HV Relay), ensuring that the power supply did not top up the charge in the self-priming circuit, and isolating the power supply from high DEG voltages. The electrical output of the system was measured by placing a 5GΩ high voltage sensor in parallel with the DEG. The energy delivered to this resistive load ($U_{LOAD}$) was calculated using the following equation:

$$U_{LOAD} = \int_{T0}^{T} \frac{V(t)^2}{R} dt$$

where V(t) is the voltage across the sensor and R is its resistance. The change in stored energy during one cycle was calculated using the following equation:

$$U_{STORE} = \frac{1}{2} C(V_2^2 - V_1^2)$$

where C is the capacitance of the whole system when the DEG was in the planar state, and $V_1$ and $V_2$ are the voltage of the DEG system at the start and end of the cycle, respectively. The efficiency, η, of the DEG was then calculated according to:

$$\eta = \frac{U_{LOAD} + U_{STORE}}{W}$$

Figure 34D:
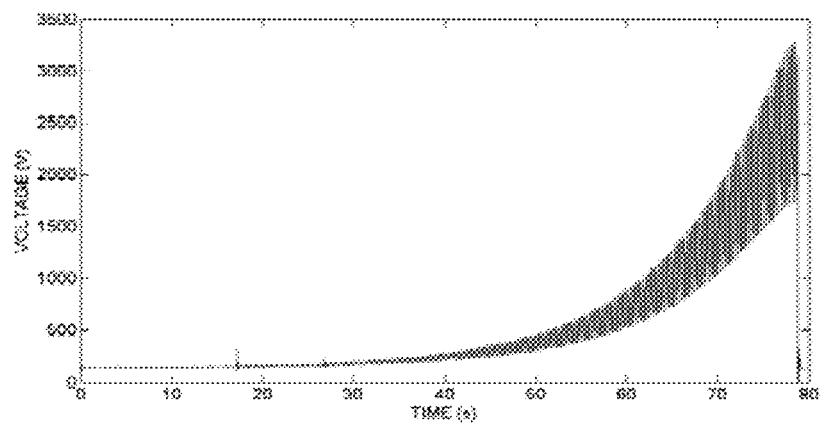

It was found that when the DEG was deformed sinusoidally, the voltage decreased as the DEG was stretched and increased when the deformation was relaxed. This is because the capacitance of the DEG increases when the DEG is stretched and decreases when the deformation is relaxed. When more power was generated than that transferred to the load, the amount of charge stored in the self-priming circuit increased with each generation cycle. Therefore the priming voltage increased. FIG. 34D shows the voltage output of a DEG operating in this "voltage-boost" mode. After 236 cycles, the priming voltage was boosted from 10V to 3250V, where the DEG failed due to dielectric breakdown.

Figure 34E:
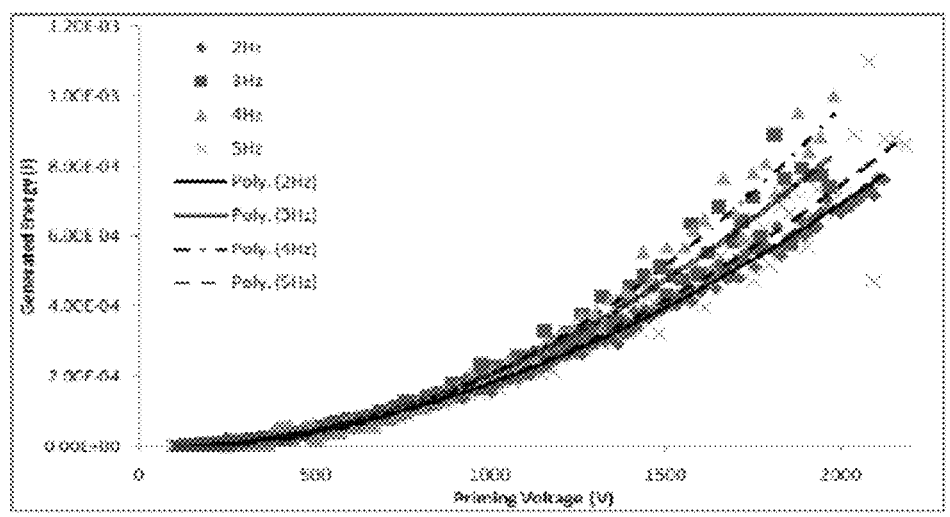
Figure 34F:
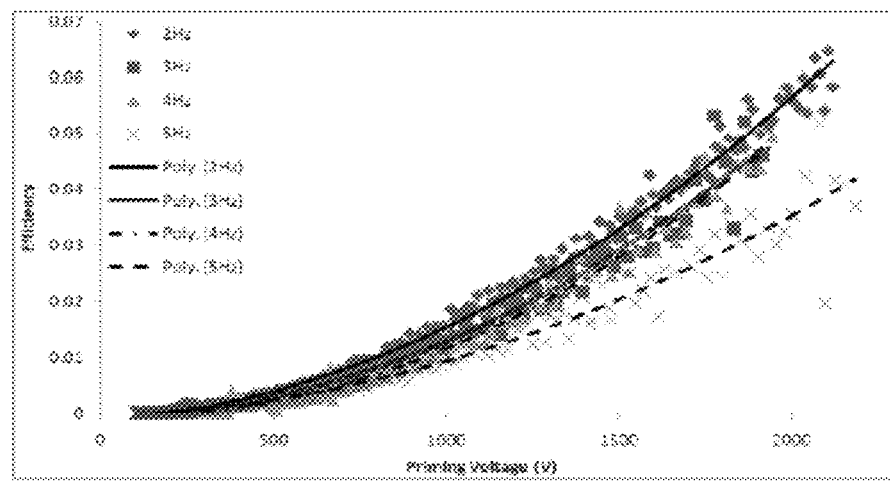

The total energy (ULOAD+USTORE) generated, and the efficiency (q) per cycle at frequencies of 2, 3, 4 and 5 Hz operating in voltage boost mode are given in FIGS. 34E and 34F, respectively. These are plotted against the priming voltage at the start of each cycle. The energy and efficiency increased as the voltage was boosted. The energy generated peaked at a frequency of 4 Hz, whereas the efficiency decreased monotonically as frequency was increased.

Figure 35:
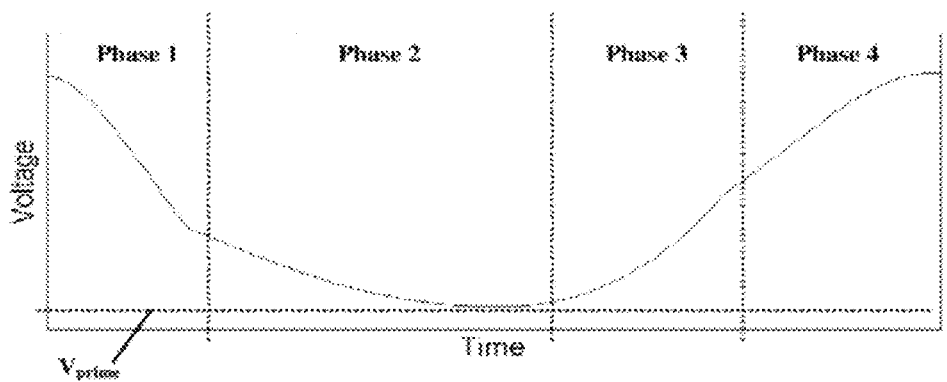
FIG. 35 is a schematic chart of a self priming DEG output waveform.

One limitation of our self-priming circuit of this embodiment is that it requires the DEG to produce a minimum voltage swing. To explain this, a schematic of the voltage waveform across a DEG in a self-priming system is given in FIG. 35. The four phases correspond to the simplified steps given in FIG. 5. There is always charge on the DEG when the self-priming circuit is used. When the capacitance of the DEG increases, it biases current to flow from the self-prime circuit to the DEG, the current flow is biased in the other direction when the capacitance decreases. However, no current flows when it is biased to flow up a voltage gradient. Referring to FIG. 35, during phases 1 and 2, the self priming circuit operates in the high charge form. During phases 3 and 4, the self priming circuit is in the high voltage form. The 4 phases of the self priming system are as follows:

1. The DEG is deformed so that its capacitance increases, but no charge is allowed to flow from the self-priming circuit to the DEG because VDEG>VSP (where VDEG is the voltage across the DEG and VSP is the voltage across the self priming circuit).
2. The DEG continues to deform, but now VDEG<VSP, so current flows from the self-priming circuit to the DEG.
3. The deformation of the DEG is relaxed so that its capacitance decreases, but no charge is allowed to flow from the DEG to the self-priming circuit because VDEG<VSP.
4. The relaxation of the DEG continues, but now VDEG>VSP, so current flows from the DEG to the self-priming circuit.

In phases 1 and 3, we see that the system has "dead zones" where no charge is transferred between the self-priming circuit and DEG until the voltage swing reaches a critical level. The required proportional voltage swing before current can flow is reduced if a smaller portion of the capacitor bank is transitioned (i.e. the self-priming circuit has a higher number of stages).

Power is transferred to the load throughout the generation cycle, even in the dead zones. Thus even when the deformations of the DEG are not large enough to enable the system to self-prime, generated power can still be delivered to the load.

As will be apparent, this principle may be used to provide force feedback in alternative and/or additional degrees of freedom. Also, the form or configuration of the dielectric elastomer bodies used may be selected depending on desired movement/force/other requirements without invention.

The entire disclosures of all applications, patents and publications cited above and below, if any, are herein incorporated by reference. However, reference to any prior art in this specification is not, and should not be taken as, an acknowledgement or any form of suggestion that that prior art forms part of the common general knowledge in the field of endeavour in any country in the world.

Wherein the foregoing description reference has been made to integers or components having known equivalents thereof, those integers are herein incorporated as if individually set forth. Further, it should be noted that various changes and modifications to the presently preferred embodiments described herein will be apparent to those skilled in the art. Such changes and modifications may be made without departing from the spirit and scope of the invention and without diminishing its attendant advantages.

It is therefore intended that such changes and modifications be included within the present invention.

The invention claimed is:

1. A self priming circuit for an electrostatic generator, the circuit including a plurality of units for controlling a priming charge on the electrostatic generator to maintain or increase or decrease the priming charge, each of said plurality of units comprising:
a plurality of capacitors; and
a plurality of diodes,
wherein:
the plurality of diodes are arranged such that at least two of the plurality of capacitors are effectively in parallel with each other when current is configured to flow in a first direction and effectively in series when current flows in a second direction, whereby the circuit has a first capacitance when current flows in the first direction greater than a second capacitance of the circuit when current flows in the second direction;
current switches from the first direction to the second direction, and
each of said plurality of units is connected in parallel with one another such that energy is generated when the first capacitance is less than double the second capacitance.

2. The circuit of claim 1, wherein the capacitance of the circuit is greater when current is configured to flow towards the generator.

3. The circuit of claim 1 adapted to be in a high charge, low voltage configuration when current flows in the first direction and/or in a low charge, high voltage configuration when current flows in the second direction.

4. The circuit of claim 1, adapted to generate a frequency controlled gain.

5. The circuit of claim 1, wherein the electrostatic generator is a dielectric elastomer generator.

6. The circuit of claim 1, wherein the current switches from the first direction to the second direction when the first capacitance is greater than the second capacitance by less than 50% of the second capacitance.

7. The circuit of claim 3, wherein the plurality of capacitors are provided in two staggered groups which can be shifted between the high charge, low voltage configuration and the low charge, high voltage configuration.

8. The circuit of claim 1, wherein when current is configured to flow in the first direction the capacitors form n+1 parallel and substantially equal first equivalent capacitances, and when current is configured to flow in the second direction the capacitors form n parallel and substantially equal second equivalent capacitances, wherein the first equivalent capacitances are greater than the second equivalent capacitances and wherein n is at least 1.

9. The circuit of claim 1, wherein at least one of the plurality of units comprises a pair of capacitors and a pair of diodes.

10. The circuit of claim 9, comprising n units and n different capacitor values.

11. The circuit of claim 10, wherein the number of units n is selected to define a percentage voltage swing % $\Delta V_{DEG\_min}$ required for self-priming to occur, according to the equation $$\% \Delta V_{DEG\_min} = \frac{100}{n}.$$

12. The circuit of claim 10, wherein n is at least two.

13. The circuit of claim 10, wherein n is at least three.

14. The circuit of claim 1, further comprising control circuitry to adjust the structure of the self priming circuit by varying the number of capacitors included in the self priming circuit.

15. The circuit of claim 1, wherein one or more of the capacitors comprises an electrostatic generator.

16. A self priming circuit for a first electrostatic generator, the circuit including a plurality of units for controlling a priming charge on the first electrostatic generator to maintain or increase or decrease the priming charge, each of said plurality of units comprising:
a plurality of second electrostatic generators; and
a plurality of diodes,
wherein:
the plurality of diodes are arranged such that at least two of the plurality of second electrostatic generators are effectively in parallel with each other when current is configured to flow in a first direction and effectively in series when current flows in a second direction; and
each of said plurality of units is connected in parallel with one another such that energy is generated when the circuit has a first capacitance when current flows in the first direction that is greater than a second capacitance of the circuit but less than double the second capacitance when current flows in the second direction.

17. The circuit of claim 16, wherein the plurality of second electrostatic generators each comprise a dielectric elastomer generator.

18. The circuit of claim 16, wherein the plurality of second electrostatic generators are configured to be deformed 180 degrees out of phase from the first electrostatic generator.

19. A transformer including an electrostatic generator and a self-priming circuit according to claim 1.

* * * * *